US009369125B2

(12) United States Patent
Alexander et al.

(10) Patent No.: US 9,369,125 B2
(45) Date of Patent: *Jun. 14, 2016

(54) BIDIRECTIONAL TWO-BASE BIPOLAR JUNCTION TRANSISTOR OPERATION, CIRCUITS, AND SYSTEMS WITH COLLECTOR-SIDE BASE DRIVEN

(71) Applicant: Ideal Power Inc., Austin, TX (US)

(72) Inventors: William C. Alexander, Spicewood, TX (US); Richard A. Blanchard, Los Altos, CA (US)

(73) Assignee: Ideal Power Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/934,026

(22) Filed: Nov. 5, 2015

(65) Prior Publication Data

US 2016/0056814 A1 Feb. 25, 2016

Related U.S. Application Data

(63) Continuation of application No. 14/735,782, filed on Jun. 10, 2015, now Pat. No. 9,190,894, which is a continuation of application No. 14/514,988, filed on Oct. 15, 2014, now Pat. No. 9,059,710, which is a (Continued)

(51) Int. Cl.
*H03K 17/66* (2006.01)
*H02M 3/158* (2006.01)
(Continued)

(52) U.S. Cl.
CPC ............ *H03K 17/66* (2013.01); *H01L 29/0619* (2013.01); *H01L 29/0804* (2013.01);
(Continued)

(58) Field of Classification Search
CPC ....... H03K 17/66; H03K 17/60; H02M 3/158; H01L 29/7393; H01L 29/0817; H01L 29/16; H01L 29/1604; H01L 29/7375; H01L 29/0804; H01L 29/0821; H01L 29/1004; H01L 29/732
See application file for complete search history.

(56) References Cited

U.S. PATENT DOCUMENTS 3,476,993 A 11/1969 Aldrich et al.
3,996,601 A 12/1976 Hutson
(Continued)

FOREIGN PATENT DOCUMENTS

DE 2231777 A1 3/1973
DE 4011509 A1 10/1990
(Continued)

OTHER PUBLICATIONS

Bourennane, A., et al., "High temperature wafer bonding technique for the realization of a voltage and current bidirectional IGBT", Power Semiconductor Devices and ICs (ISPSD), 2011 IEEE 23rd International Symposium on, May 26, 2011, pp. 120-123, Publisher: IEEE.

(Continued)

*Primary Examiner* — Stephen W Smoot
*Assistant Examiner* — Pavel Ivanov
(74) *Attorney, Agent, or Firm* — Groover & Associates PLLC; Gwendolyn Groover; Robert Groover

(57) ABSTRACT

Methods, systems, circuits, and devices for power-packet-switching power converters using bidirectional bipolar transistors (BTRANs) for switching. Four-terminal three-layer BTRANs provide substantially identical operation in either direction with forward voltages of less than a diode drop. BTRANs are fully symmetric merged double-base bidirectional bipolar opposite-faced devices which operate under conditions of high non-equilibrium carrier concentration, and which can have surprising synergies when used as bidirectional switches for power-packet-switching power converters. BTRANs are driven into a state of high carrier concentration, making the on-state voltage drop very low.

10 Claims, 27 Drawing Sheets

Related U.S. Application Data continuation of application No. 14/313,960, filed on Jun. 24, 2014, now Pat. No. 9,029,909.

(60) Provisional application No. 61/841,624, filed on Jul. 1, 2013, provisional application No. 61/914,491, filed on Dec. 11, 2013, provisional application No. 61/914,538, filed on Dec. 11, 2013, provisional application No. 61/924,884, filed on Jan. 8, 2014, provisional application No. 61/925,311, filed on Jan. 9, 2014, provisional application No. 61/928,133, filed on Jan. 16, 2014, provisional application No. 61/928,644, filed on Jan. 17, 2014, provisional application No. 61/929,731, filed on Jan. 21, 2014, provisional application No. 61/929,874, filed on Jan. 21, 2014, provisional application No. 61/933,442, filed on Jan. 30, 2014, provisional application No. 62/007,004, filed on Jun. 3, 2014, provisional application No. 62/008,275, filed on Jun. 5, 2014, provisional application No. 61/838,578, filed on Jun. 24, 2013.

(51) Int. Cl.

| *H01L 29/739* | (2006.01) |
|---|---|
| *H01L 29/08* | (2006.01) |
| *H01L 29/16* | (2006.01) |
| *H01L 29/737* | (2006.01) |
| *H02M 1/088* | (2006.01) |
| *H02M 7/797* | (2006.01) |
| *H03K 3/012* | (2006.01) |
| *H03K 17/687* | (2006.01) |
| *H01L 29/06* | (2006.01) |
| *H01L 29/10* | (2006.01) |
| *H01L 29/73* | (2006.01) |
| *H02M 11/00* | (2006.01) |
| *H01L 29/732* | (2006.01) |
| *H03K 17/60* | (2006.01) |
| *H01L 29/417* | (2006.01) |
| *H01L 29/423* | (2006.01) |

(52) U.S. Cl.
CPC ........ *H01L29/0817* (2013.01); *H01L 29/0821* (2013.01); *H01L 29/1004* (2013.01); *H01L 29/16* (2013.01); *H01L 29/1604* (2013.01); *H01L 29/41708* (2013.01); *H01L 29/42304* (2013.01); *H01L 29/73* (2013.01); *H01L 29/732* (2013.01); *H01L 29/7375* (2013.01); *H01L 29/7393* (2013.01); *H01L 29/7395* (2013.01); *H02M 1/088* (2013.01); *H02M 3/158* (2013.01); *H02M 3/1582* (2013.01); *H02M 7/797* (2013.01); *H02M 11/00* (2013.01); *H03K 3/012* (2013.01); *H03K 17/60* (2013.01); *H03K 17/687* (2013.01)

(56) References Cited

U.S. PATENT DOCUMENTS

| 4,131,902 | A | 12/1978 | Kub |
|---|---|---|---|
| 4,816,892 | A | 3/1989 | Temple |
| 4,980,743 | A | 12/1990 | Nakagawa et al. |
| 5,040,042 | A | 8/1991 | Bauer et al. |
| 5,608,237 | A | 3/1997 | Aizawa |
| 5,793,064 | A | 8/1998 | Li |
| 5,852,559 | A | 12/1998 | Li |
| 5,910,664 | A | 6/1999 | Ajit |
| 6,313,488 | B1 | 11/2001 | Bakowski et al. |
| 7,728,367 | B2 | 6/2010 | Bui |
| 8,796,750 | B2 | 8/2014 | Bui |
| 2002/0060330 | A1 | 5/2002 | Onishi et al. |
| 2003/0042537 | A1 | 3/2003 | Nakamura et al. |
| 2003/0057480 | A1 | 3/2003 | Mathieu |
| 2004/0070027 | A1 | 4/2004 | Nielson et al. |
| 2006/0118818 | A1 | 6/2006 | Shimoida et al. |
| 2006/0249752 | A1 | 11/2006 | Asano |
| 2006/0261346 | A1 | 11/2006 | Ryu et al. |
| 2008/0191238 | A1 | 8/2008 | Madathil et al. |
| 2009/0058500 | A1 | 3/2009 | Osawa et al. |
| 2011/0121407 | A1 | 5/2011 | Quoirin et al. |
| 2014/0111892 | A1 | 4/2014 | Chen et al. |
| 2014/0240027 | A1 | 8/2014 | Blanchard et al. |
| 2014/0339600 | A1 | 11/2014 | Yoshikawa |

FOREIGN PATENT DOCUMENTS

| DE | 4014207 A1 | 12/1990 |
|---|---|---|
| DE | 102004005384 A1 | 8/2005 |
| DE | 102005047101 B3 | 1/2007 |
| EP | 0111804 B1 | 9/1987 |
| EP | 0438700 A1 | 7/1991 |
| EP | 2325890 | 5/2011 |
| GB | 1513000 A | 6/1978 |
| GB | 2380604 B2 | 2/2005 |
| GB | 2510716 A1 | 8/2014 |
| JP | S58218168 A | 12/1983 |
| JP | H01146366 A2 | 6/1989 |
| JP | H03147378 A | 6/1991 |
| JP | 2004342718 A2 | 12/2004 |
| JP | 2008205512 A2 | 9/2008 |
| JP | 2009141270 A2 | 6/2009 |
| JP | 2009295684 A2 | 12/2009 |
| WO | 2011008567 A2 | 1/2011 |
| WO | 2014122472 A1 | 8/2014 |

OTHER PUBLICATIONS

Crebier, Jean-Christophe, "Integration monolithique et composants de puissance", Institut National Polytechnique de Grenoble—INPG, Jul. 17, 2006.

European Search Report in related EP Application No. 14816902.2 (published as EP2901483), Sep. 14, 2015, Publisher: European Patent Office.

Guo, Der-Feng, et al., "Investigation of Amplifying and Switching Characteristics in Double Heterostructure-Emitter Bipolar Transistors", Journal of the Electrochemical Society, Jan. 1, 2007, pp. H283, vol. 154, No. 4.

Hobart, K.D., et al., "Characterization of a Bi-Directional Double-Side Double-Gate IGBT Fabricated by Wafer Bonding", Power Semiconductor Devices and ICs, 2001, Proceedings of the 13th International Symposium on, Jun. 7, 2001, pp. 125-128, Publisher: Power Semiconductor Devices and ICs, 2001, Proceedings of the 13th International Symposium on.

Ideal Power Inc., "B-TRAN Ð D Bi-Directional Bi-Polar Junction TRANsistor", Aug. 20, 2015.

Luther-King, Ngwendson, et al., "MOS Control Device Concepts for AC-AC Matrix Converter Applications: The HCD Concept for High-Efficiency Anode-Gated Devices", IEEE Transactions on Electron Devices, Sep. 9, 2005, pp. 2075-2080, vol. 52, No. 9, Publisher: IEEE.

Nguyen, Binh-Dac, et al., "AC switches with integrated gate driver supplies", Sep. 14, 2005, p. 9, Publisher: IEEE.

Nishi, Ronald Yutaka, "Theory of Conductivity Modulation in Semiconductors", Jun. 1, 1962, Publisher: University of British Columbia.

Phung, Luong Viet, et al., "Modeling of a New SOI Bidirectional Bipolar Junction Transistor for Low-Loss Household Appliances", Electron Devices, IEEE Transactions on, Mar. 22, 2011, pp. 1164-1169, vol. 58, No. 4, Publisher: IEEE.

Phung, Luong Viet, et al., "Modelling of a symmetrical bipolar monolithic bidirectional switch", Power Electronics and Applications, Sep. 10, 2009, pp. 1-9.

Wu, J.-W., et al., "Low-temperature hydrophobic wafer bonding for 1200V, 25A bi-directional Si UMOS IGBTs", Lester Eastman Conference on High Performance Devices (LEC), Aug. 7, 2014, pp. 1-4.

Zhao, Shanqi, et al., "Design, fabrication and characterization of a bi-directional insulated gate bipolar transistor", Solid-State and Integrated Circuits Technology, Oct. 21, 2004, vol. 1, Publisher: Solid-State and Integrated Circuits Technology.

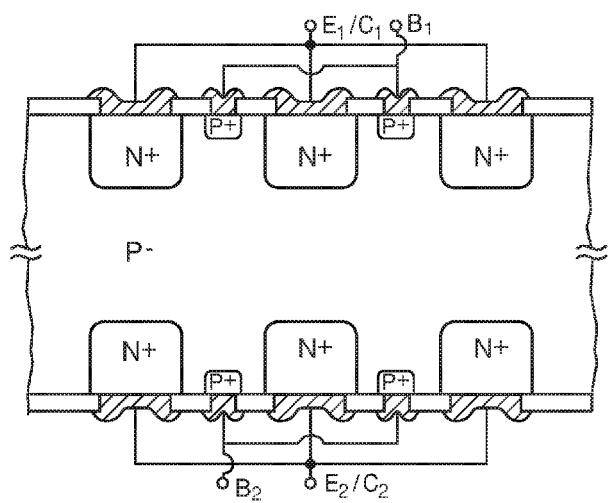
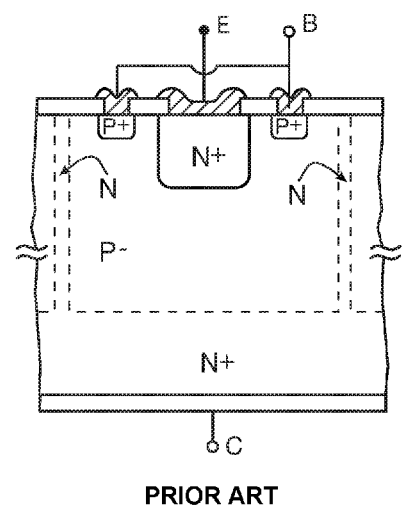
FIG. 4A
PRIOR ART
FIG. 4B

BIDIRECTIONAL TWO-BASE BIPOLAR JUNCTION TRANSISTOR OPERATION, CIRCUITS, AND SYSTEMS WITH COLLECTOR-SIDE BASE DRIVEN

CROSS-REFERENCE

Priority is claimed from U.S. applications 61/838,578 filed Jun. 24, 2013; 61/841,624 filed Jul. 1, 2013; 61/914,491 filed Dec. 11, 2013; 61/914,538 filed Dec. 11, 2013; 61/924,884 filed Jan. 8, 2014; 61/925,311 filed Jan. 9, 2014; 61/928,133 filed Jan. 16, 2014; 61/928,644 filed Jan. 17, 2014; 61/929,731 filed Jan. 21, 2014; 61/929,874 filed Jan. 21, 2014; 61/933,442 filed Jan. 30, 2014; 62/007,004 filed Jun. 3, 2014; and 62/008,275 filed Jun. 5, 2014, each and every one of which is hereby incorporated by reference.

BACKGROUND

The present application relates to bidirectional bipolar transistors, and more particularly to power converters which incorporate bidirectional bipolar transistors, and also to related methods.

Note that the points discussed below may reflect the hindsight gained from the disclosed inventions, and are not necessarily admitted to be prior art.

Power Packet Switching Converters

A new kind of power converter was disclosed in U.S. Pat. No. 7,599,196 entitled "Universal power conversion methods," which is incorporated by reference into the present application in its entirety. This patent describes a bidirectional (or multidirectional) power converter which pumps power into and out of a link inductor which is shunted by a capacitor.

The switch arrays at the ports are operated to achieve zero-voltage switching by totally isolating the link inductor+capacitor combination at times when its voltage is desired to be changed. (When the inductor+capacitor combination is isolated at such times, the inductor's current will change the voltage of the capacitor, as in a resonant circuit. This can even change the sign of the voltage, without loss of energy.) This architecture is now referred to as a "current-modulating" or "Power Packet Switching" architecture. Bidirectional power switches are used to provide a full bipolar (reversible) connection from each of multiple lines, at each port, to the rails, i.e. the internal lines across which the link inductor and its capacitor are connected.

The conventional epitaxial base NPN transistor has an N+ region over the entire back surface. This necessarily prevents the structure from having the same electrical characteristics in each direction when operated as a bidirectional transistor. These structures are therefore not well-suited to acting as bidirectional switches in power-packet-switching power converter architectures.

Semiconductor statistics under high level non-equilibrium carrier densities can be quite different from low level carrier densities. Conventional recombination is generally less relevant with high level carrier density than in low level conditions. Typical definitions of carrier lifetime are also less relevant. Carriers can often interact directly in high level conditions through Auger interactions. The beta (ratio of emitter current to base current) will therefore normally decrease as a bipolar transistor is driven into high level non-equilibrium carrier densities. These densities can be, for example, more than two orders of magnitude above intrinsic carrier density.

The voltage drop under conditions of high level non-equilibrium carrier concentration will be low, even if the resistivity under small currents is large. Thus a device can be optimized to withstand high voltages (e.g. 1200V or more) while still achieving a forward voltage drop of less than a Volt.

Systems, Circuits, Devices, and Methods with Bidirectional Bipolar Transistors

The present application teaches, among other innovations, power-packet-switching power converters in which bidirectional bipolar transistors are used as switches.

The present application also teaches, among other innovations, methods for operating power-packet-switching power converters using bidirectional bipolar transistors for fully-bidirectional switching.

The present application also teaches, among other innovations, power-packet-switching power converters in which drive circuits operate bidirectional bipolar transistors for bidirectional switching.

The present application also teaches, among other innovations, methods for operating power-packet-switching power converters using drive circuits to control bidirectional bipolar transistors for bidirectional switching.

The present application also teaches, among other innovations, methods for fabricating bidirectional bipolar transistors for power-packet-switching power converters.

The present application also teaches, among other innovations, power-packet-switching power conversion systems having bidirectional bipolar transistors, in which power-packet-switching power converters use bidirectional bipolar transistors for switching.

The present application also teaches, among other innovations, methods of operating power-packet-switching power conversion systems, in which bidirectional bipolar transistors are used for bidirectional switching.

The above innovations are implemented, in various disclosed embodiments, by using merged double-base bidirectional opposite-faced devices which operate under conditions of high non-equilibrium carrier concentration, and which avoid diode drops. For maximum efficiency, it is preferable to use devices which provide bidirectional conduction with less than a diode drop (approximately 1 V in silicon) in each direction, despite reduced effective gains.

BRIEF DESCRIPTION OF THE DRAWINGS

The disclosed inventions will be described with reference to the accompanying drawings, which show important sample embodiments and which are incorporated in the specification hereof by reference, wherein:

FIG. 4A shows a sample embodiment of a device according to the present inventions.

FIG. 4B shows a sample conventional transistor.

DETAILED DESCRIPTION OF SAMPLE EMBODIMENTS

Figure 1A:
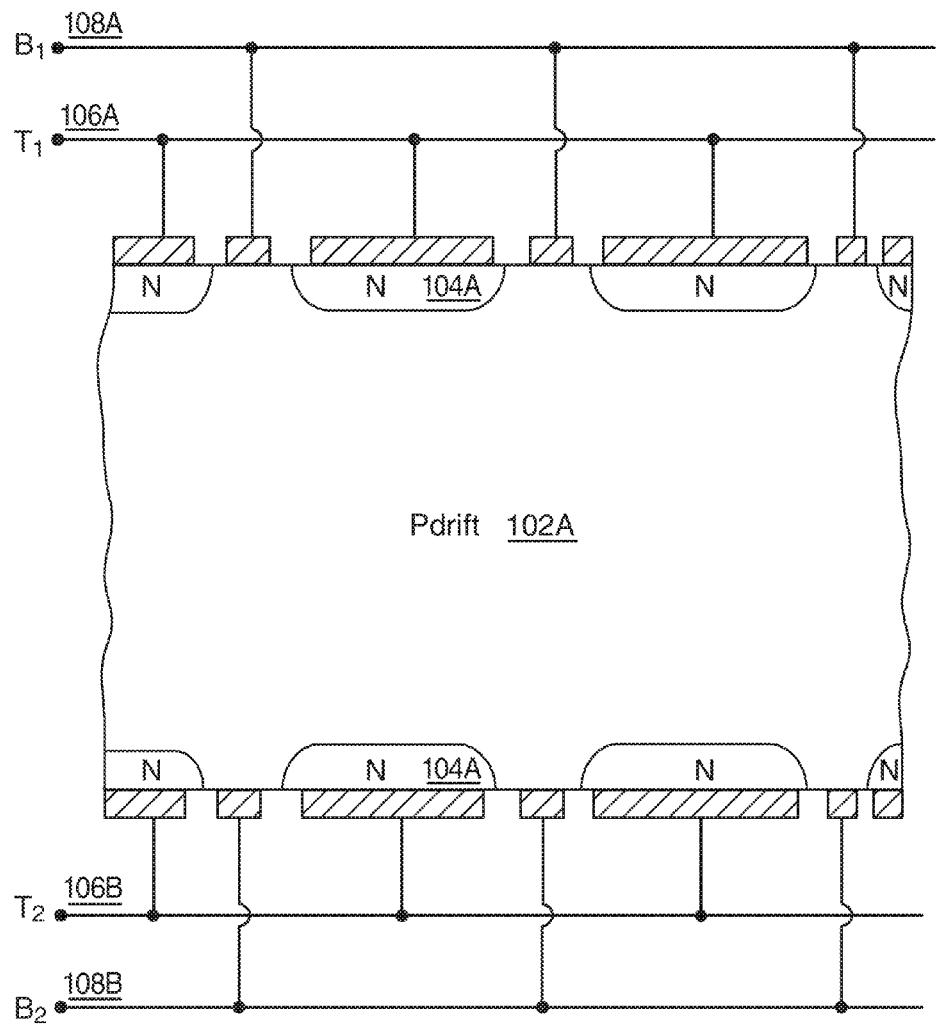
FIGS. 1A and 1B show sample embodiments of devices according to the present inventions.

The numerous innovative teachings of the present application will be described with particular reference to presently preferred embodiments (by way of example, and not of limitation). The present application describes several inventions, and none of the statements below should be taken as limiting the claims generally.

An important general principle of the various inventive embodiments disclosed herein is that, in a power-packet-switching power converter, switching is accomplished synergistically by using merged double-base bidirectional opposite-faced devices which operate under conditions of high non-equilibrium carrier concentration. For maximum efficiency, it is preferable to use devices which provide bidirectional conduction with less than a diode drop (approximately 1 V in silicon) in each direction.

A power-packet-switching (PPS) converter needs fully bidirectional drive devices, due to the unique architecture. Efficiency is a key criterion in PPS converter designs—even more than in other converter designs, because PPS converters already achieve such high efficiencies. (An additional 1% of inefficiency is minor in a design which operates at e.g. 85% efficiency, but makes a drastic difference in a design which is achieving 98%.)

One element of efficiency is losses in the switching devices. IGBT devices are inherently liable to an on-state voltage difference caused by the forward "diode drop" voltage (in addition to any resistive losses). While FETs typically do not suffer from a diode drop, they must deal with the lack of conductivity modulation: their ON resistance cannot be lower than the intrinsic resistance of the base semiconductor.

The innovative devices of the present inventions overcome the diode drop problem of the IGBT, while also achieving very low ON resistance from conductivity modulation. Switching losses are low, at least in part by virtue of active turn-off from having base contacts on both sides. IGBTs have inherently slow turn-off since they turn-off open base, which forces those devices to be made with very short carrier lifetimes, which in turn increases the forward voltage drop.

The present application teaches a new approach to switching device design for PPS converters. By driving a fully-symmetric double-base bipolar into a state of high carrier concentration, the on-state voltage drop is made very low. This is contrary to conventional wisdom, because such a heavy drive current imposes greater demands on the base drive circuitry, and reduces the effective gain (beta) of the device.

The fully-symmetric double-base bipolar is implemented as a "collectorless" structure, in which emitter and base structures are formed on both front and back surfaces of a semiconductor wafer (typically a thinned wafer). Depending on the instantaneous direction of current, one of the two opposed emitter diffusions will operate as a collector. Heavy base current is applied to the emitter which is not acting as a collector, to achieve a high non equilibrium carrier concentration, and hence a low on-state voltage drop.

A number of alternative and improved device structures are disclosed, which individually and in various combinations reduce the required base drive (for a given power level). These include e.g. heterojunction emitters, tunnel oxides, field-shaping regions below the base contact, and vertical relations between the emitter and base depths.

The present inventions teach, inter alia, a bidirectional bipolar transistor (BTRAN), which is a vertically-symmetric, four-terminal, three-layer, vertical-current-flow semiconductor device. A BTRAN is most preferably formed as an NPN device, but can also be e.g. a PNP device.

BTRANs are high-level injection devices, and recombination thus occurs quite differently from in low level injection devices. Presently-preferred sample embodiments combine high level carrier injection with thick base regions. In one sample embodiment, the base region can be e.g. 60 μm.

An important realization is that the voltage drop under conditions of high level non-equilibrium carrier concentration will be low, even if the resistivity under small currents is large. Thus a device can be optimized to withstand high voltages (e.g. 1200V or more) while still achieving a forward voltage drop which is less than one diode drop.

The disclosed devices combine synergistically with the power-packet-switching (PPS) power converter architecture by providing fully-bidirectional switching with less than a diode drop, high voltage resistance, and high ruggedness. The disclosed devices can be 100% bidirectional, with low on-resistance at full current.

For reference, in this type of switching bidirectional bipolar, the side which is instantaneously acting as the emitter can be referred to as the anode, and the other side the cathode.

Basic Implementations

Simple NPN and PNP implementations will be described first. Improvements on this generation of sample embodiments, as discussed below, are more preferable, but this version helps to illustrate basic concepts and principles more clearly.

In the NPN sample embodiment of FIG. 1A, p-type semiconductor base layer 102A has N+ emitter/collector regions 104A on an upper and a lower surface. Emitter/collector terminals 106A and 106B are connected on opposite sides of the BTRAN to respective N+ emitter/collector regions 104A.

Similarly, base terminals 108A and 108B are connected on opposite sides of the BTRAN to respective external portions of P type base/drift region 102A. Each of base terminals 108A and 108B can be left "open" (e.g. not connected to anything), shorted to respective terminal 106A or 106B (e.g. 108A to 106A or 108B to 106B), or connected to a power source.

Figure 1B:
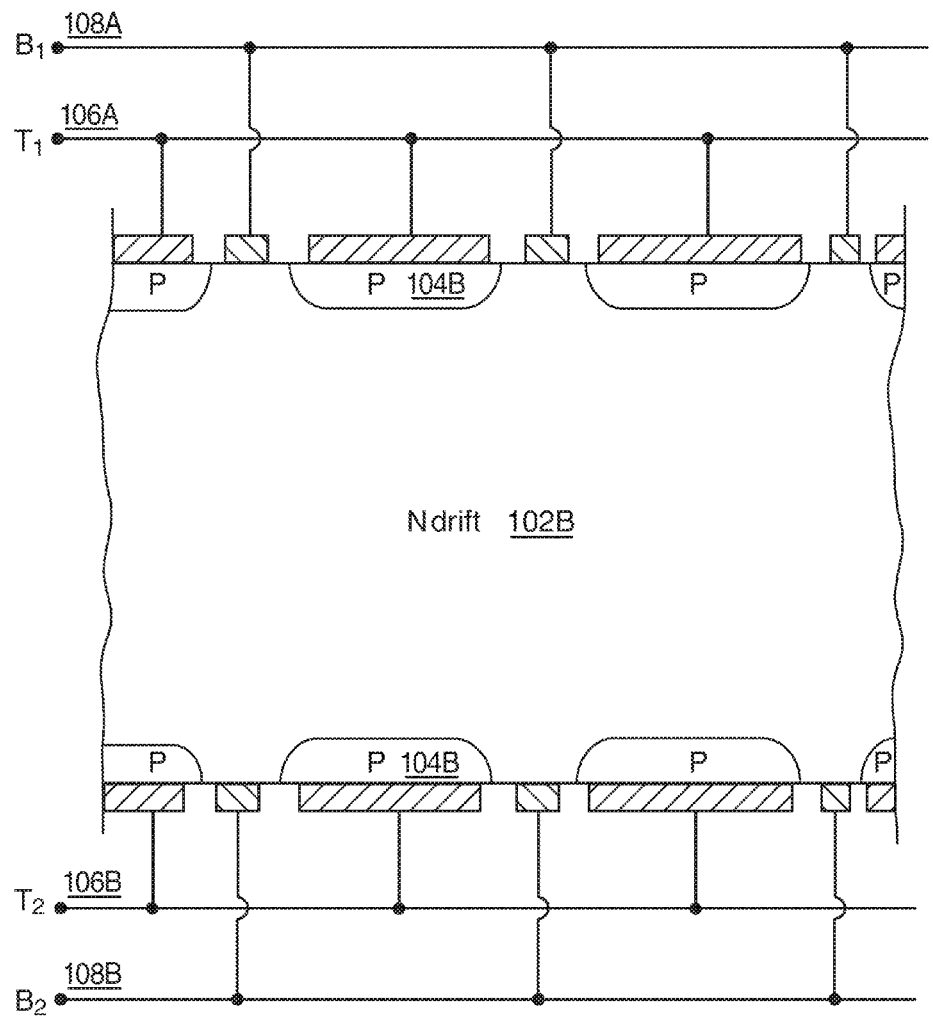

The PNP sample embodiment of FIG. 1B is similar to the NPN sample embodiment of FIG. 1A, except that N-type emitter/collector regions 104A become P-type emitter/collector regions 104B, and P-type drift region 102A becomes N-type drift region 102B.

Methods of Operation

Figure 2:
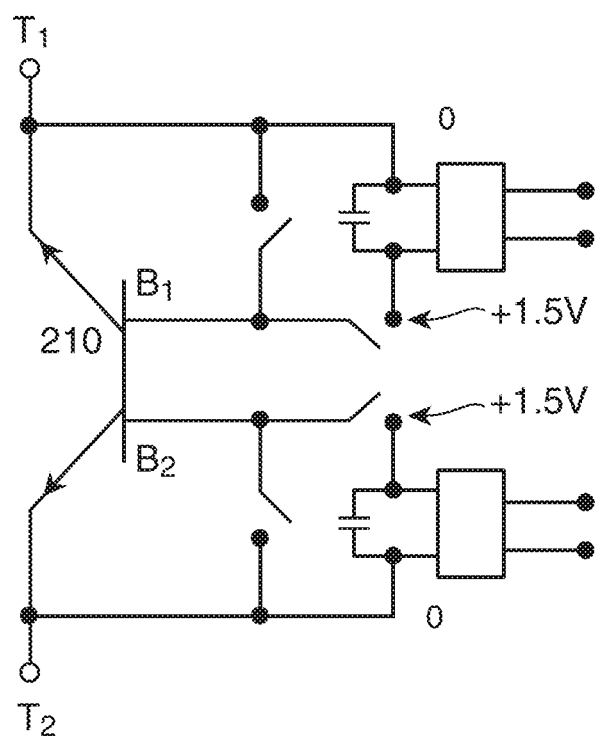
FIG. 2 shows one sample embodiment of a base drive circuit according to the present inventions.

FIG. 2 shows a simplified schematic of one implementation of a base drive circuit, which can be used with FIGS. 3A-3F to illustrate the basic operation of BTRAN 210.

Figure 3A:
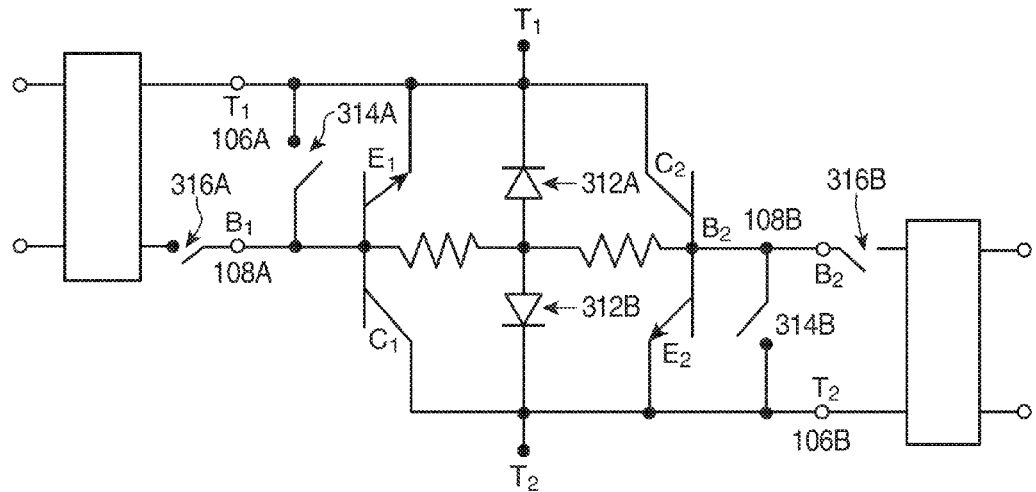
FIGS. 3A, 3B, 3C, 3D, 3E, and 3F show sample equivalent circuits for an exemplary device in various stages of operation.

FIG. 3A shows a sample equivalent circuit for one exemplary NPN BTRAN. Body diodes 312A and 312B can correspond to e.g. the upper and lower P-N junctions, respectively. In, for example, the sample embodiment of FIG. 1A, these can correspond to the junctions between emitter/collector regions 104A and base regions 102A. Switches 314A and 314B can short respective base terminals 108A and 108B to respective emitter/collector terminals 106A and 106B.

Figure 3B:
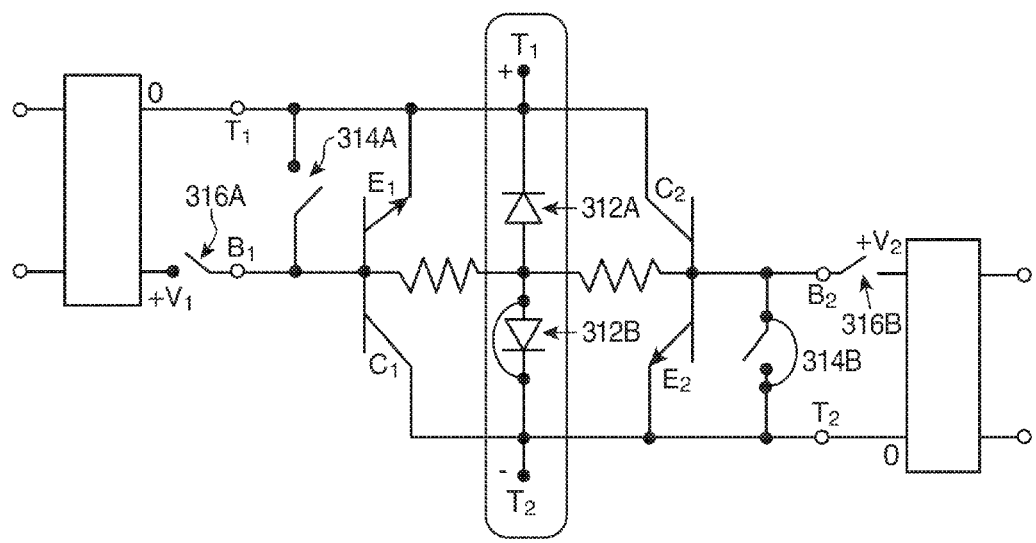

In one sample embodiment, a BTRAN can have six phases of operation in each direction, as follows:

1) Initially, as seen in FIG. 3B, voltage on emitter/collector terminal T1 is positive with respect to emitter/collector terminal T2. Switches 314A and 316A are open, leaving base terminal B1 open. Switch 314B is closed, shorting base terminal B2 to emitter/collector terminal T2. This, in turn, functionally bypasses body diode 312B. In this state, the device is turned off. No current will flow in this state, due to the reverse-biased P-N junction (represented by body diode 312A) at the upper side of the device.

Figure 3C:
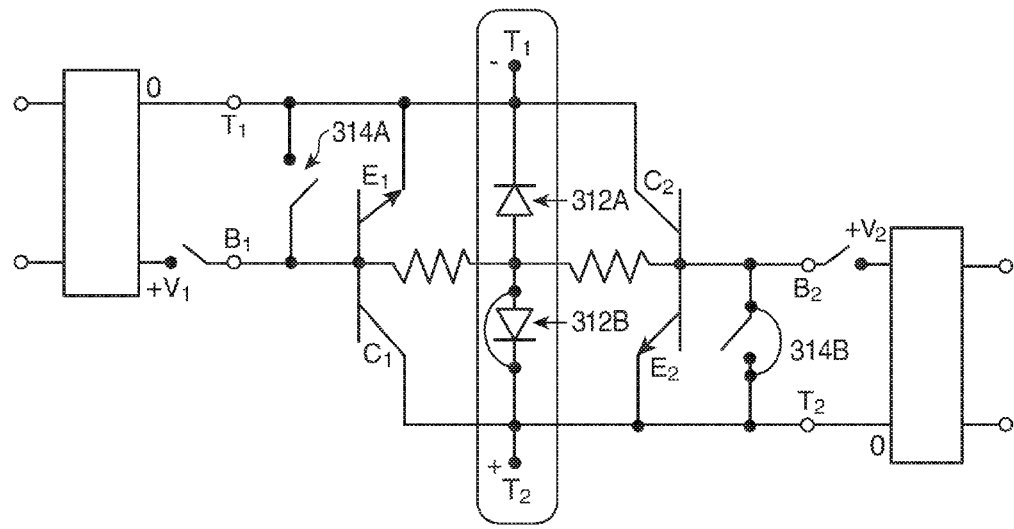

2) As seen in FIG. 3C, the voltage on emitter/collector terminal T1 is brought negative with respect to emitter/collector terminal T2. P-N diode junction 312A is now forward biased, and now begins injecting electrons into the drift region. Current flows as for a forward-biased diode.

After a short time, e.g. a few microseconds, the drift layer is well-charged. The forward voltage drop is low, but greater in magnitude than 0.7 V (a typical silicon diode voltage drop). In one sample embodiment, a typical forward voltage drop (Vf) at a typical current density of e.g. $200 A/cm^2$ can have a magnitude of e.g. 1.0 V.

Figure 3D:
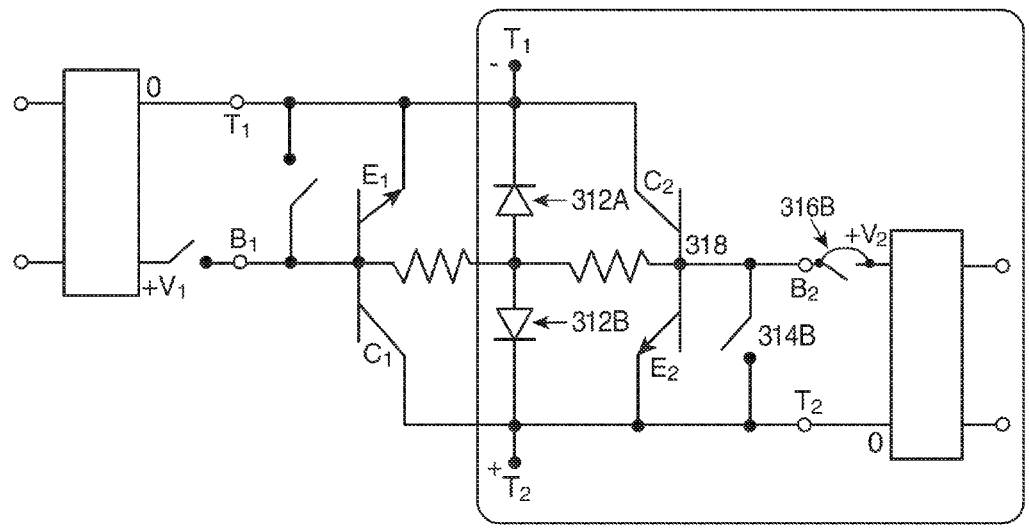

3) To further reduce forward voltage drop Vf, the conductivity of the drift region is increased, as in e.g. FIG. 3D. To inject more charge carriers (here, holes) into the drift region, thereby increasing its conductivity and decreasing forward voltage drop Vf, base terminal B2 is disconnected from terminal T2 by opening switch 314B. Base terminal B2 is then connected to a source of positive charge by switch 316B. In one sample embodiment, the source of positive charge can be, e.g., a capacitor charged to +1.5 VDC. As a result, a surge current will flow into the drift region, thus injecting holes. This will in turn cause upper P-N diode junction 312A to inject even more electrons into the drift region. This significantly increases the conductivity of the drift region and decreases forward voltage drop Vf to e.g. 0.1-0.2 V, placing the device into saturation.

4) Continuing in the sample embodiment of FIG. 3D, current continuously flows into the drift region through base terminal B2 to maintain a low forward voltage drop Vf. The necessary current magnitude is determined by, e.g., the gain of equivalent NPN transistor 318. As the device is being driven in a high level injection regime, this gain is determined by high level recombination factors such as e.g. surface recombination velocity, rather than by low-level-regime factors such as thickness of, and carrier lifetime within, the base/drift region.

Figure 3E:
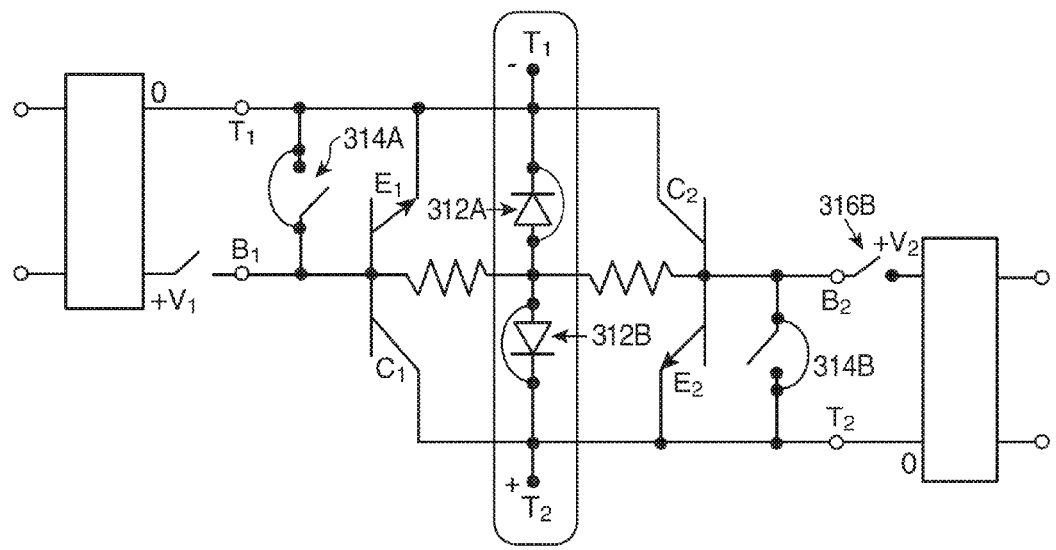

5) To turn the device off, as in e.g. FIG. 3E, base terminal B2 is disconnected from the positive power supply and connected instead to emitter terminal T2, opening switch 316B and closing switch 314B. This causes a large current to flow out of the drift region, which in turn rapidly takes the device out of saturation. Closing switch 314A connects base terminal B1 to collector terminal T1, stopping electron injection at upper P-N junction 312A. Both of these actions rapidly remove charge carriers from the drift region while only slightly increasing forward voltage drop Vf. As both base terminals are shorted to the respective emitter/collector terminals by switches 314A and 314B, body diodes 312A and 312B are both functionally bypassed.

Figure 3F:
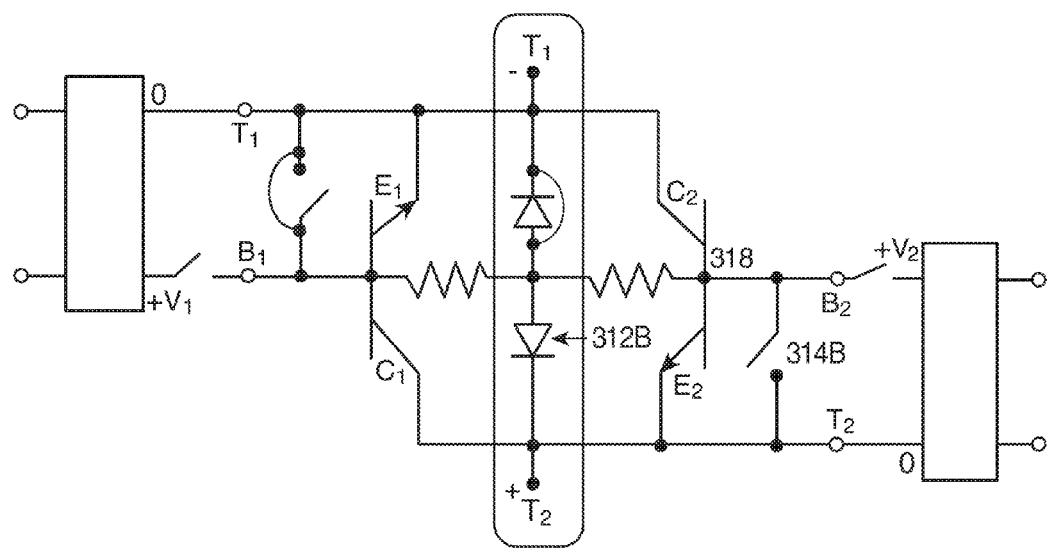

6) Finally, at an optimum time (which can be e.g. nominally 2 µs for a 1200 V device), full turn-off can occur, as seen in e.g. FIG. 3F. Full turn-off can begin by opening switch 314B, disconnecting base terminal B2 from corresponding terminal T2. This causes a depletion region to form from lower P-N diode junction 312B as it goes into reverse bias. Any remaining charge carriers recombine, or are collected at the upper base. The device stops conducting and blocks forward voltage.

The procedure of steps 1-6 can, when modified appropriately, used to operate the device in the opposite direction. Steps 1-6 can also be modified to operate a PNP BTRAN (e.g. by inverting all relevant polarities).

BTRAN with Deep Emitters on Both Faces

Figure 5A:
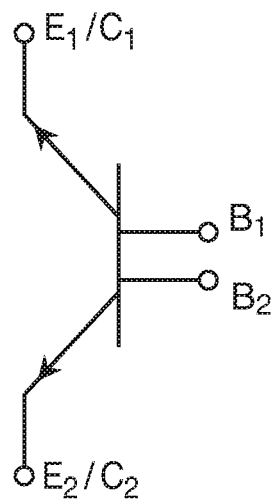
FIG. 5A shows a sample proposed circuit symbol.
Figure 5B:
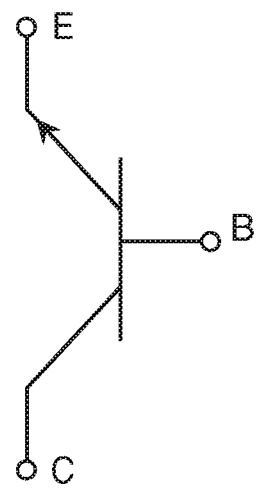
FIG. 5B shows a circuit symbol for a conventional transistor.

FIG. 4A shows another sample embodiment of an epitaxial base BTRAN (the circuit symbol of which can be seen in FIG. 5A) according to the present inventions. By contrast, FIG. 4B shows a conventional epitaxial base bipolar transistor (the circuit symbol of which can be seen in FIG. 5B). These two devices differ significantly in their structures, even beyond the presence of a second base contact region on the bottom surface of the BTRAN.

Figure 6:
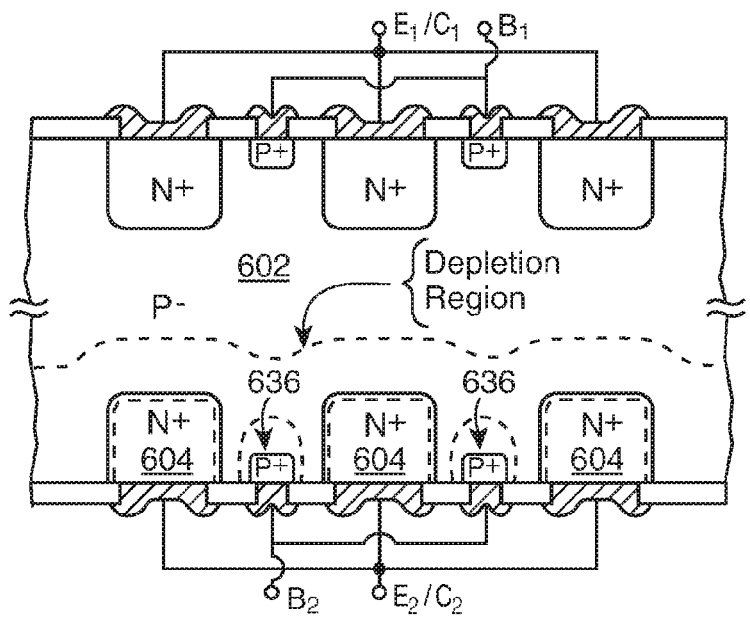
FIG. 6 shows another sample embodiment of the present inventions.

In the sample embodiment of FIG. 6, base contact regions 636 are not connected to adjacent heavily doped N+ emitter/collector regions 604 and a relatively high reverse bias is applied across the nearby reverse-biased collector-to-base junction between emitter/collector regions 604 and base 602. The depletion region of the reverse-biased collector-to-base junction will electrically isolate lower base contact regions 636 from the rest of base 602.

This condition, that base contact regions 636 on one side of the device are electrically isolated from the remainder of base 602 when a sufficiently high reverse voltage is present across the associated reverse-biased base-to-collector junction, can be obtained, for example, through a combination of the following parameters.

1) Have a sufficiently-lightly-doped base region. This requirement can be easily met, since the doping concentration of the base region helps determine the breakdown voltage of the base-to-collector junction, and since the N+ emitter/collector regions are more heavily doped (as seen in e.g. FIG. 4A).

2) Have N+ regions extend deeper than P+ base contact regions so the depletion of the reverse-biased base-to-collector junction spreads across the region beneath the base contact. This condition can be met, e.g., by introducing the P+ doping species sufficiently long after the introduction of the N+ doping species, or by using a P+ doping species that diffuses more slowly than the N+ doping species, or by a combination of these two techniques.

Figure 7A:
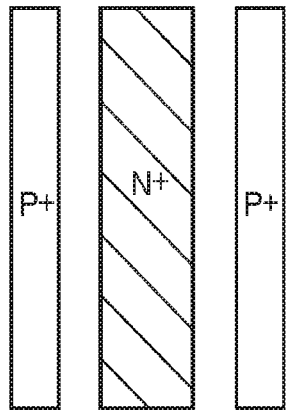
FIG. 7A shows a top view of a sample conventional transistor.
Figure 7B:
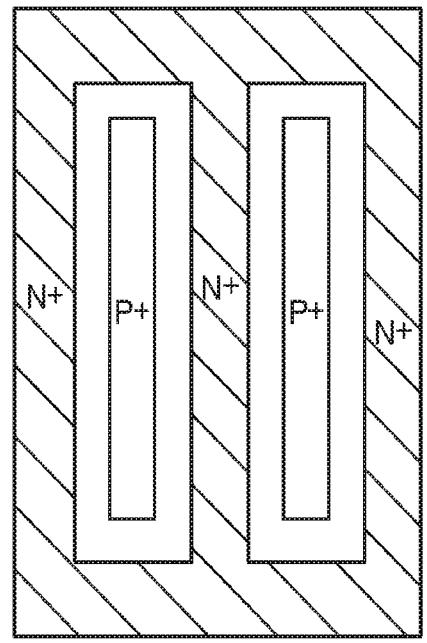
FIG. 7B shows a top view of one sample embodiment of the present inventions.

3) Use a cell geometry wherein the depletion region of the reverse-biased base-to-collector junction isolates all of the associated base contact regions. This requirement is not met in a conventional epitaxial base NPN transistor, a top view of which can be seen in FIG. 7A. For greatest current density, base contact regions will be present on both sides of each of the emitter regions in the device of FIG. 7A. However, the exemplary BTRAN of FIG. 7B has openings in the N+ emitter region where P+ base contact regions are formed. Heavily-doped N+ emitter regions surround each P+ base contact region with a junction that can form the needed depletion region, as seen in e.g. FIGS. 8A-8D.

Figure 8A:
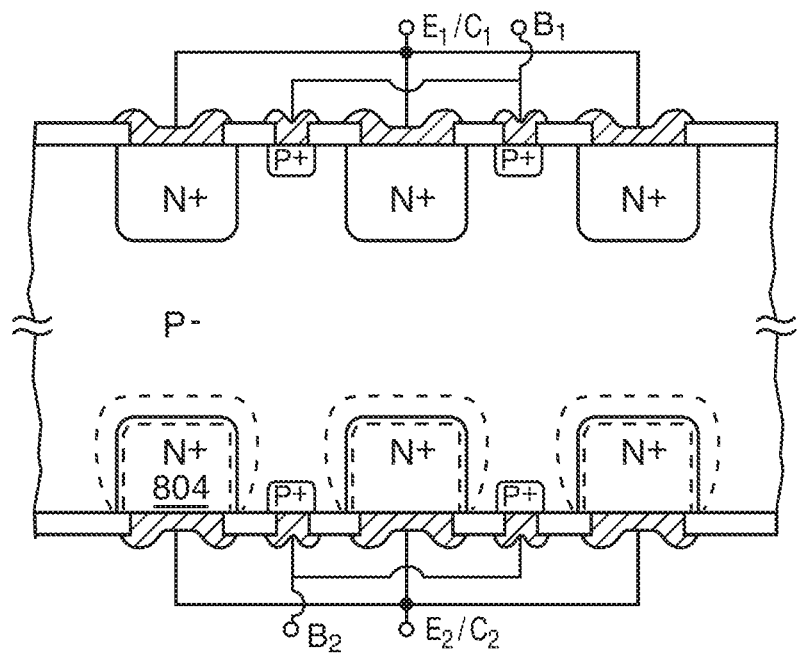
FIGS. 8A, 8B, 8C, and 8D show several sample embodiments of the present inventions.
Figure 8B:
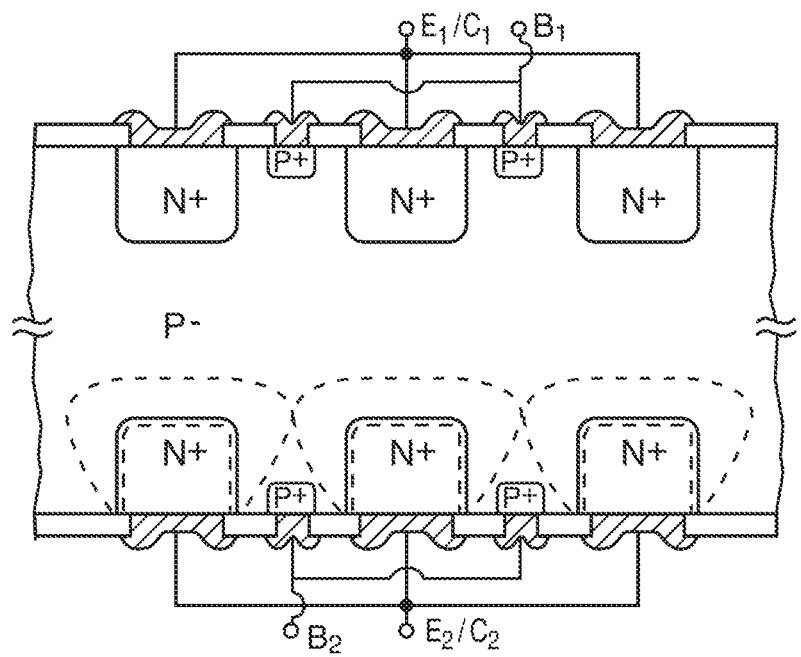
Figure 8C:
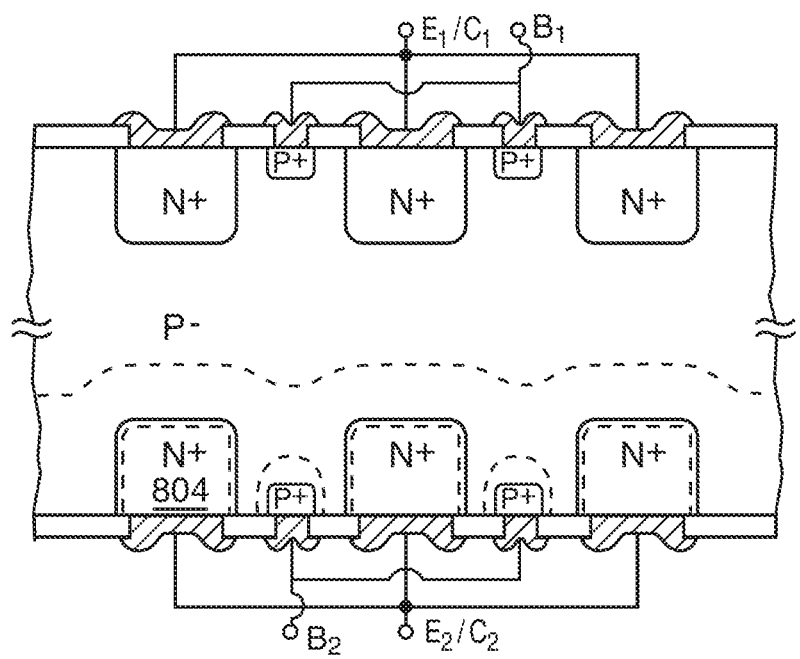
Figure 8D:
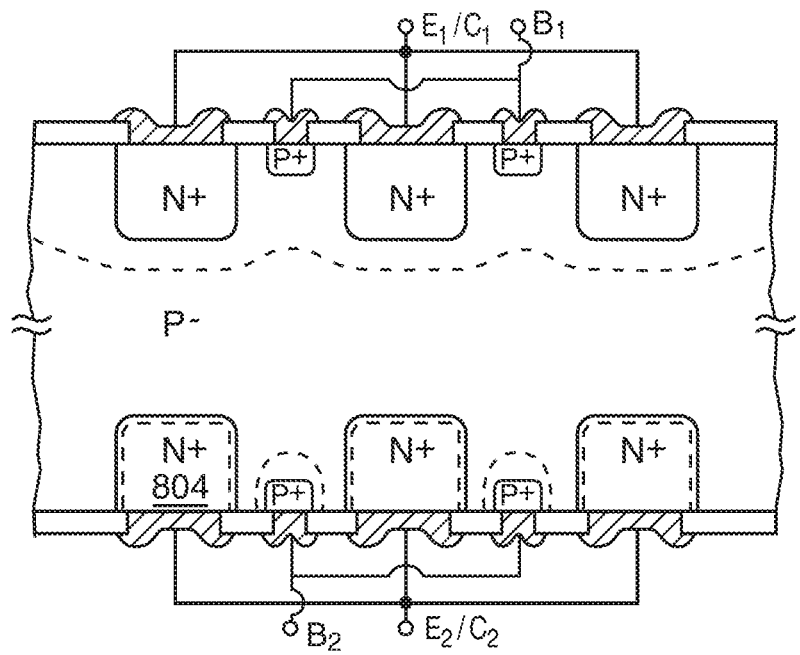

In FIG. 8A, a low reverse bias is present across terminals B2 and E2/C2. Separate depletion regions have formed around each reverse-biased N+ region 804. As the reverse bias increases, the depletion regions begin to merge, as in e.g. FIG. 8B. As the reverse bias continues to increase, the depletion region widens, as in e.g. FIG. 8C. In FIG. 8D, the reverse-bias voltage between emitter/collector terminal E2/C2 and base terminal B2 has continued increasing until it approaches the breakdown voltage.

Trench Isolation

Figure 13A:
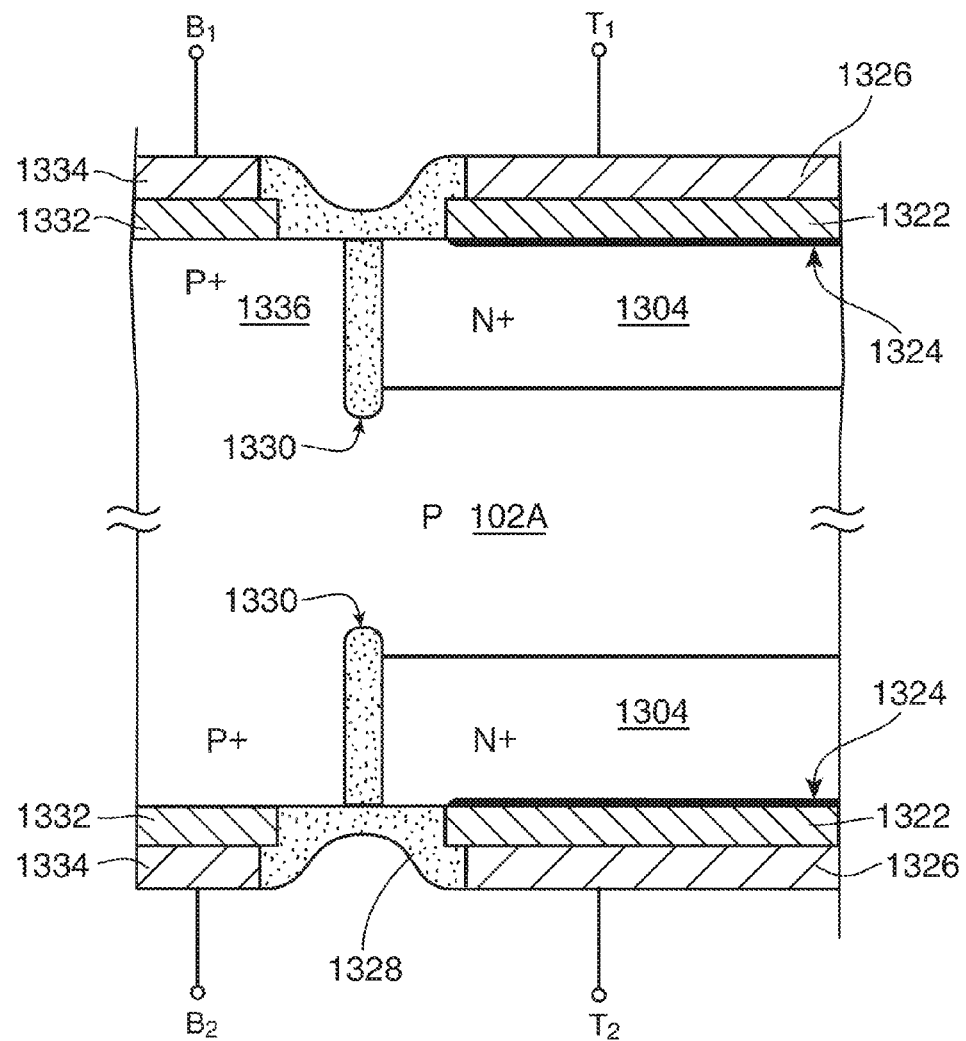
FIGS. 13A, 13B, and 13C show further sample embodiments of devices according to the present inventions.

Note that FIG. 13A shows oxide-filled trenches, on each surface, which laterally separate the emitter region (N+ for an NPN) from the adjacent base contact region. This structure, and its advantages, will be described further in the following sections.

Tunnel Oxide

As a result of the high level non-equilibrium carrier densities, in an NPN BTRAN, it is typically desirable to maximize electron injection from emitter to base while minimizing hole injection from base to emitter. In some sample embodiments, high electron injection from emitter to base and low hole injection from base to emitter can be achieved using tunnel oxide, which can be on the order of e.g. 10 Å (1 nm). Electrons will typically have a much higher probability to tunnel through the thin tunnel oxide than will holes.

In one sample embodiment, this can be accomplished by providing a thin layer of tunnel oxide between emitter regions and emitter contacts. In the sample embodiment of FIG. 13A, a thin layer of tunnel oxide 1324 is present between N+ emitter region 1304 and polysilicon layer 1322. Poly layer 1322, in turn, contacts emitter metallization 1326. Oxide 1328 fills trench 1330, in addition to separating metallization 1326 and poly 1322 from base poly layer 1332 and metallization 1334. Oxide 1328 in trench 1330 further minimizes unwanted same-side carrier recombination between emitter region 1304 and otherwise-adjacent base contact region 1336.

Figure 13B:
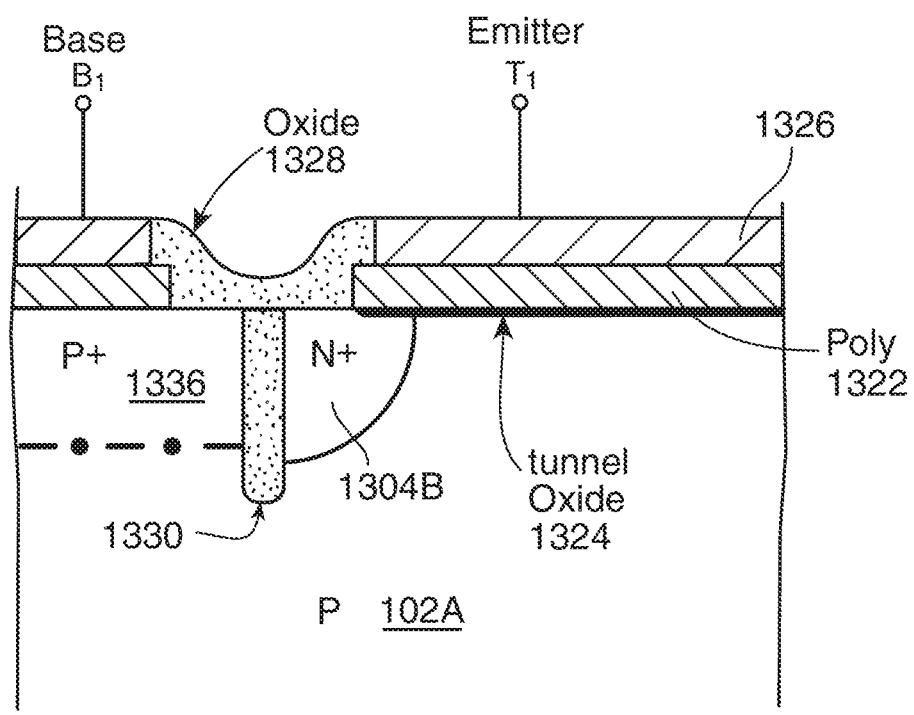

In the sample embodiment of FIG. 13B, N+ emitter region 1304B is significantly smaller than in, e.g., the sample embodiment of FIG. 13A. This in combination with tunnel oxide layer 1324 can reduce opportunities for undesired hole injection and recombination in emitter region 1304.

Figure 13C:
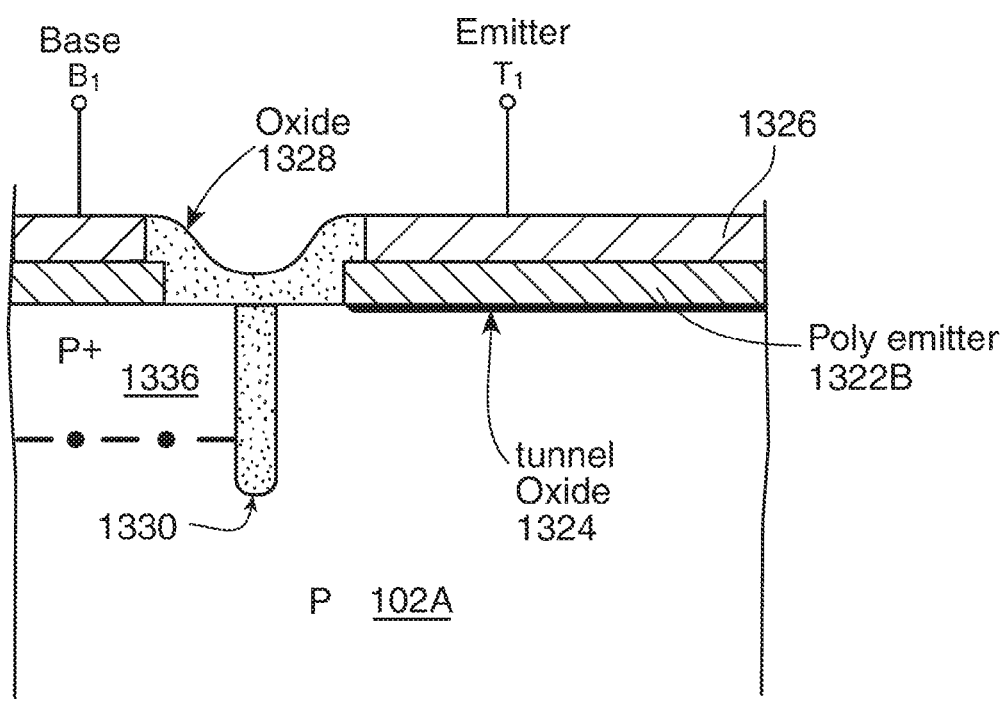

The N+ emitter regions can also be entirely absent, as in the sample embodiment of FIG. 13C. Poly region 1322B can instead act as an emitter, and is protected from undesired hole injection and recombination by tunnel oxide layer 1324 between base region 102A and emitter 1322B. (It will of course be understood that the sample embodiments of FIGS. 13B-13C show only one side of each device, which will generally be fabricated identically on both surfaces.)

Surface recombination velocity, which can be a factor in high-level-regime current gain, can be problematic due to recombination at the metal contacts, primarily on the emitter contacts. In some sample embodiments, tunnel oxide can be used to nearly eliminate this recombination in NPN BTRANs by blocking holes from reaching the emitter contact. In the sample embodiment of FIG. 14A, tunnel oxide 1424A is disposed between emitter regions 1404 and base 102A. As in FIG. 13A, oxide-filled trench 1330 is disposed between N+ emitter regions 1404 and P+ base contact regions 1336. Since N+ emitter regions 1404 are deposited on top of tunnel oxide 1424A, N+ regions 1404 can be e.g. polycrystalline silicon, rather than being formed as part of the mono crystalline substrate.

Figure 14A:
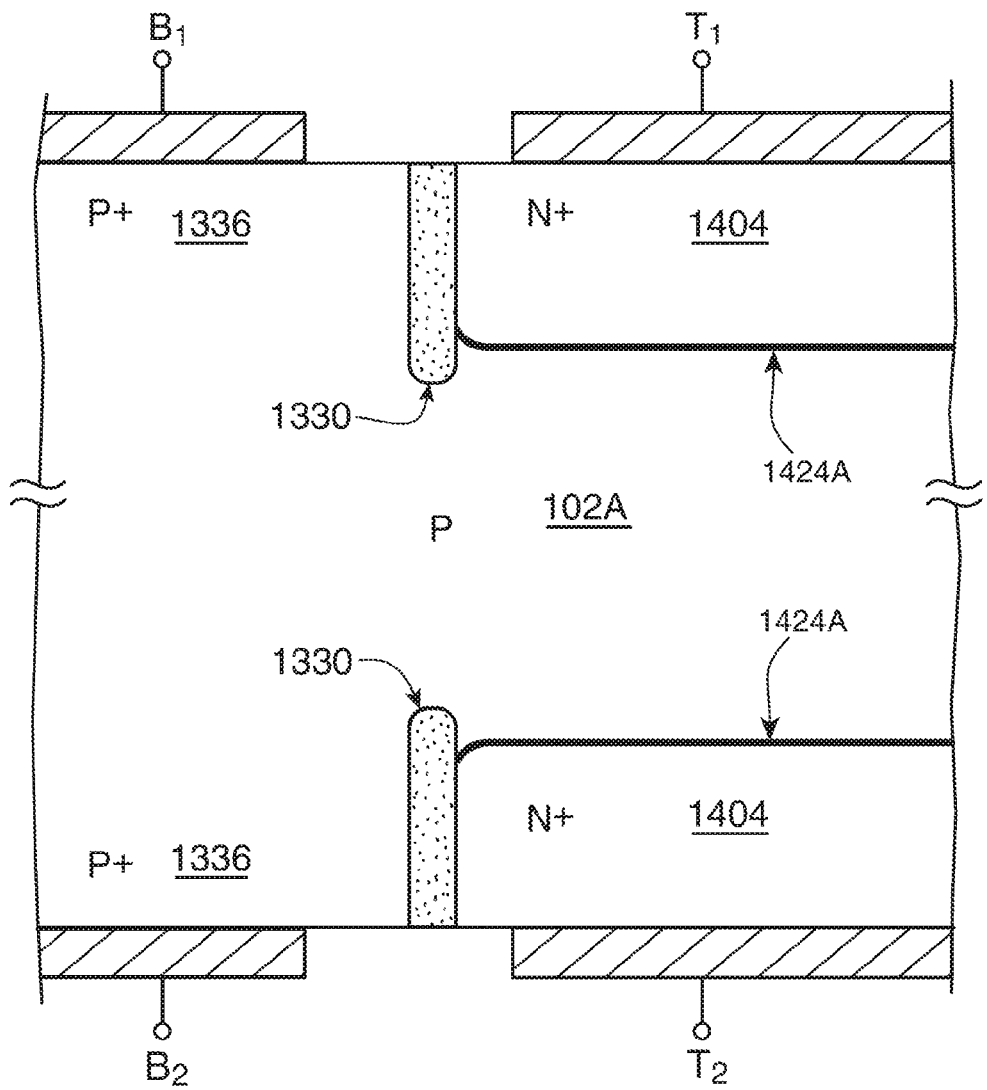
FIGS. 14A-14B show further sample embodiments of according to the present inventions.
Figure 14B:
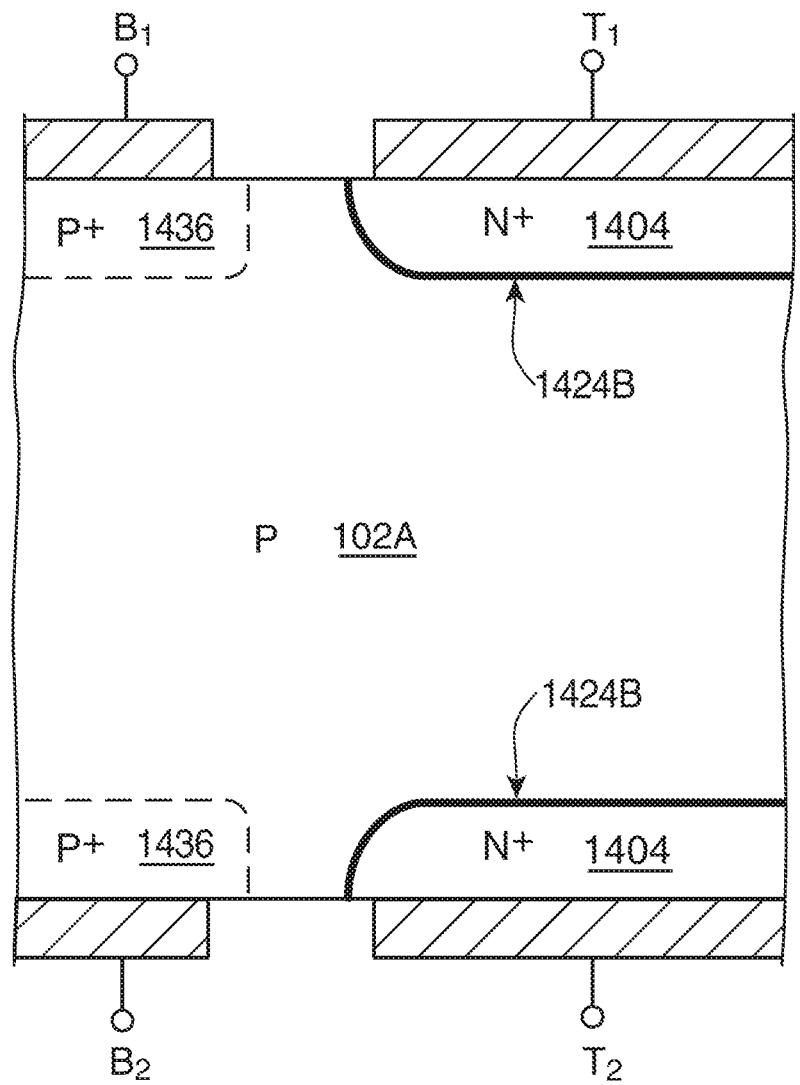

In the sample embodiment of FIG. 14B, tunnel oxide 1424B continues along the edge of polycrystalline N+ emitter regions 1404 to the surface of the device. In the absence of the oxide-filled trenches of e.g. FIG. 14A, P+ base contact regions 1436 are offset from emitter regions 1404 in order to not contact tunnel oxide 1424B around N+ emitter regions 1404. This separation fulfills a purpose similar to the oxide-filled trenches of FIG. 14A by minimizing undesirable direct electrical contact between base contact regions 1436 and emitter regions 1404. This can help minimize unwanted same-side carrier flow and recombination between emitter and base contact regions.

The sample embodiment of FIG. 14B is somewhat less preferable than that of FIG. 14A, however. In the sample embodiment of FIG. 14A, the structure with sidewall 1330 can be more compact, and tunnel oxide 1424A is only on the bottom of N+ regions 1404. In the sample embodiment of FIG. 14B, the necessary separation between N+ regions 1404 and P+ regions 1436 increases cell size. Tunnel oxide 1424B must also be formed over a larger surface area than in FIG. 14A, increasing fabrication complexity.

Devices with Heterojunction Emitter

Figure 15:
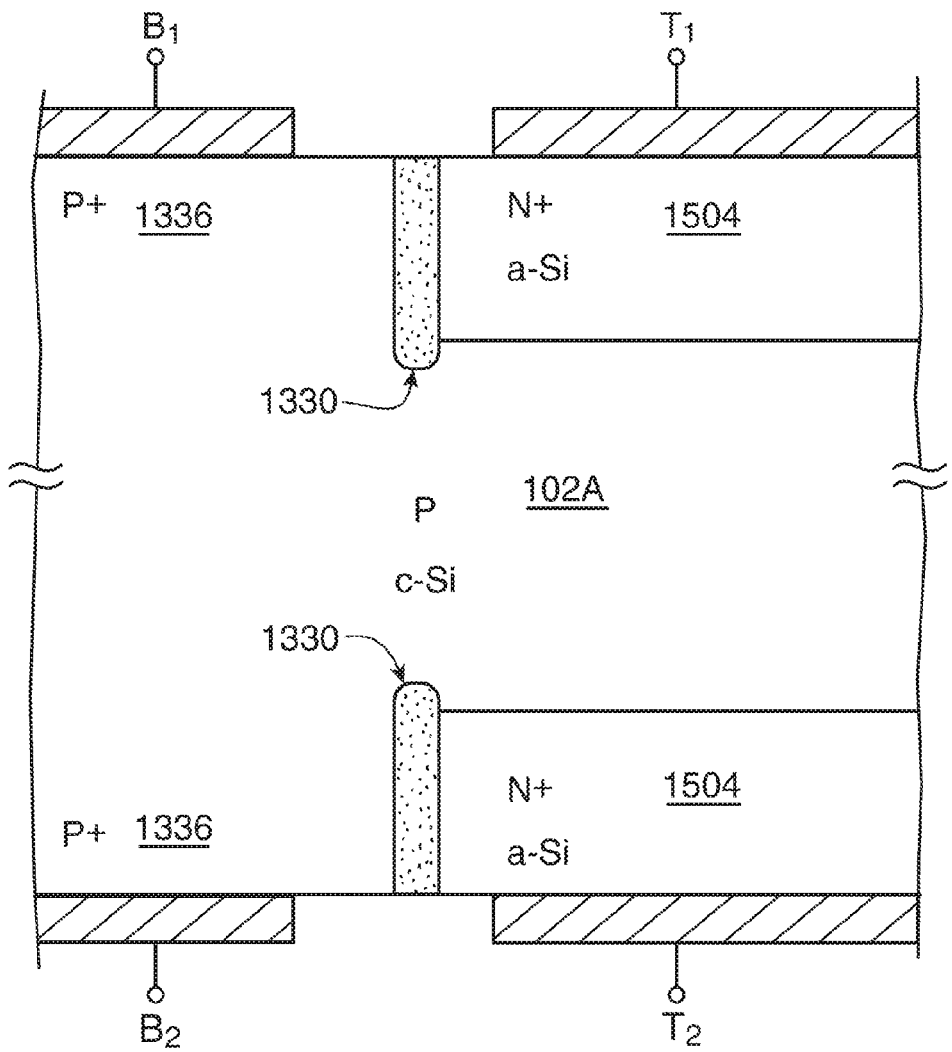
FIG. 15 shows another sample embodiment of a device according to the present inventions.

In other sample embodiments, electron-hole discrimination can be achieved using heterojunction emitter regions. In the sample embodiment of FIG. 15, emitter regions 1504 can be e.g. amorphous silicon on a crystalline substrate. As amorphous silicon has a band gap of 1.4 V, compared to a band gap of 1.1 V for crystalline silicon, electrons injected from emitter 1504 to base 102A are relatively energetic, and more electrons are injected from emitter 1504 to base 102A than holes from base 102A to emitter 1504.

Base Drive

Base drive circuits according to the present inventions are preferably applied to each of the two base terminals of a BTRAN to permit operation as described herein. In one sample embodiment, sample BTRAN base drive circuits preferably permit a BTRAN to turn on as a diode; transition to a very-low-forward-voltage saturation mode after initial turn-on; transition back to a no-longer-saturated-but-still-on state; achieve stored charge reduction prior to turn-off to reduce tail current; and then achieve full turn-off and block forward voltage.

Figure 9:
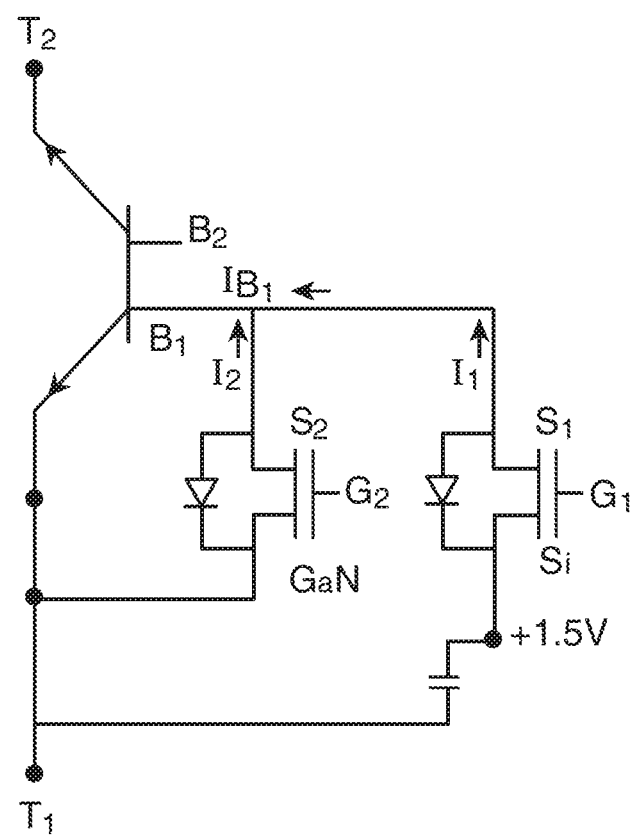
FIG. 9 shows one sample embodiment of a base drive circuit according to the present inventions.

In one sample NPN embodiment, a base drive circuit like that of FIG. 9 can be applied to both base B1 and base B2, and can operate e.g. as follows.

a. Open base B1: base terminal B1 is free to float, and negative voltage from opposite terminal T2 is blocked. The expected floating base voltage can be, e.g., in the range of 0.7 V to less than 20 V. In this state, opposite base terminal B2 is shorted to respective opposite terminal T2. In the sample embodiment of FIG. 9, base B1 can be left floating by turning off MOSFET switches S1 and S2.

b. Base B1 shorted to terminal T1: base terminal B1 is shorted to respective terminal T1, e.g. by turning switch S1 off and turning switch S2 on. Opposite base terminal B2 is open, and positive voltage from opposite terminal T2 is blocked. Alternatively, the base drive can be in this state while the BTRAN conducts in forward-biased diode mode when opposite terminal T2 is negative. In this latter state, the nominal forward voltage drop Vf can be, e.g., between 1 V and 3 V for silicon diodes.

c. Base B1 connected to positive bias: Base terminal B1 is connected to a source of positive charge, e.g. by turning on switch S1 and turning off switch S2. In this state, opposite base B2 is open, while the BTRAN is conducting in forward-biased saturated NPN bipolar transistor mode. The nominal forward voltage drop can be, e.g., approximately 0.2 V. A large current flows to base B1 from the positive bias immediately after connection. Subsequent current flow is lower.

d. Immediately following step (c), base terminal B1 is connected to respective terminal T1, e.g. by opening switch S1 and closing switch S2, while opposite base terminal B2 is open. A large current briefly flows to terminal T1 from base terminal B1. This rapidly depletes charge carriers in the drift region. The device comes out of saturation and reverts to forward-biased diode mode.

e. Immediately following step (d), opposite base terminal B2 is shorted to respective opposite terminal T2 by a similar mechanism. A small current flows to base terminal B1 from respective terminal T1, and charge carriers are swept from the drift region, increasing forward voltage drop Vf.

f. Immediately following step (e), base terminal B1 is floated, e.g. by turning switches S1 and S2 off, while opposite base terminal B2 remains shorted to respective opposite terminal T2. The BTRAN turns off as the PN junction between base terminal B1 and respective terminal T1 becomes reverse biased.

In one sample embodiment, switch S2 can be e.g. a GaN MOSFET. Since switch S2 conducts and blocks voltage in both directions, and the largest positive voltage switch S2 sees is +1.5 V, a GaN MOSFET can be preferable for switch S2, since the body diode of a GaN MOSFET does not conduct current at 1.5 V or less.

Figure 10:
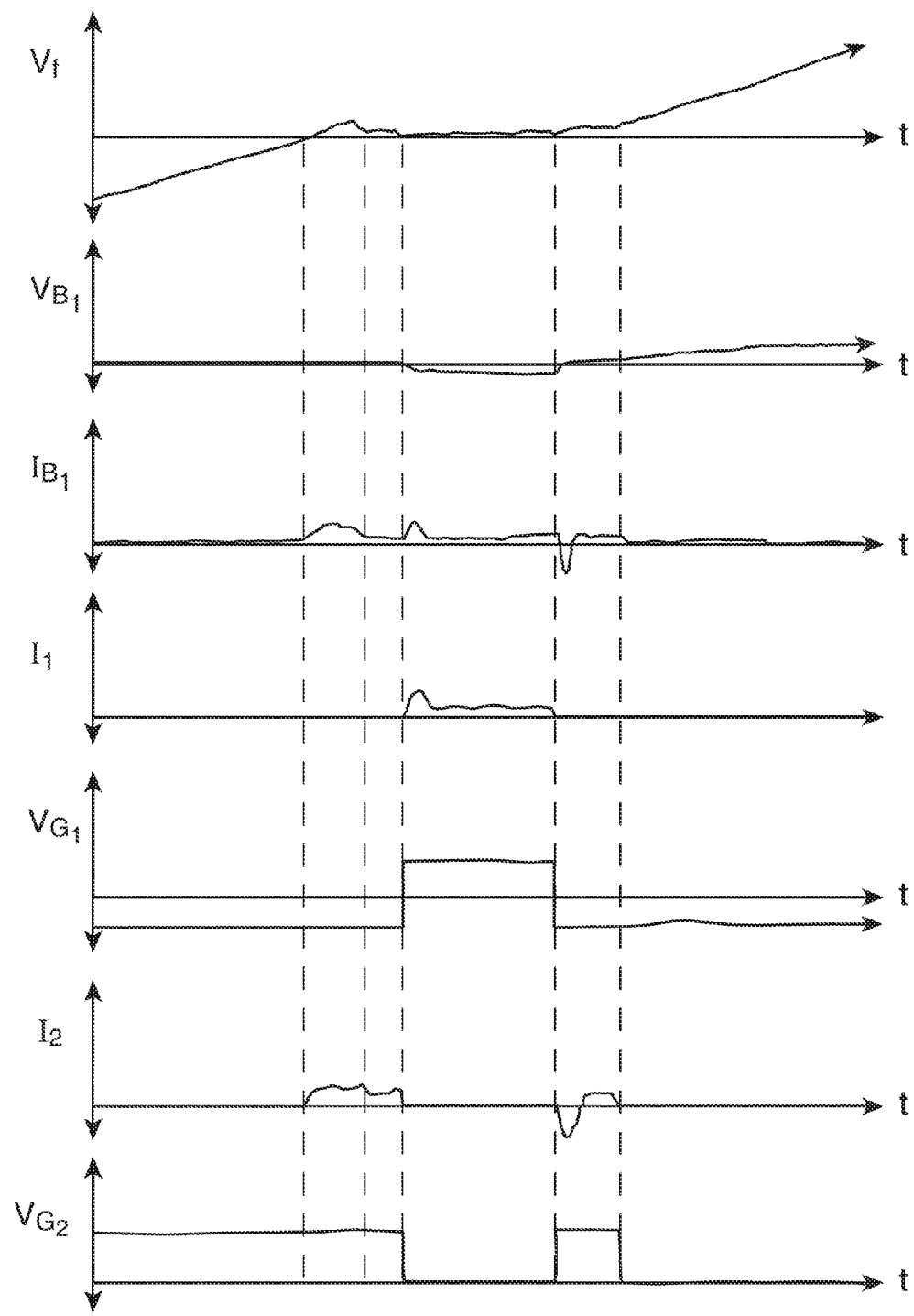
FIG. 10 shows sample currents and voltages for one sample embodiment of the present inventions.
Figure 11:
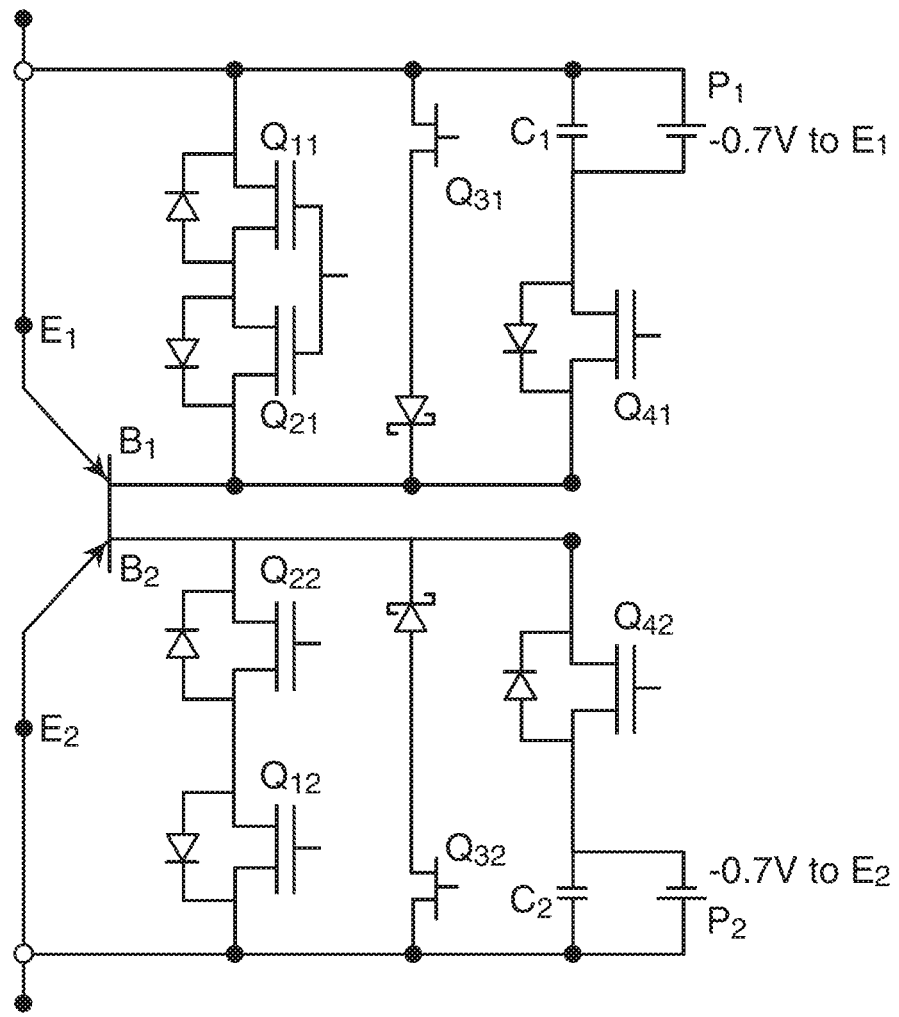
FIG. 11 shows another sample embodiment of a base drive circuit.

FIG. 10 shows plots of some sample currents and voltages during a process according to the present inventions, e.g. like that of steps (a)-(f) above, modified for a PNP sample embodiment like that of FIG. 11.

FIG. 11 shows one sample embodiment of a PNP BTRAN base drive circuit which can include common source MOSFET pairs for base-emitter shorting. Isolated power supplies P1 and P2 are included in parallel with respective capacitors C1 and C2. In one sample embodiment, isolated power supply P1 can be at, e.g., −0.7 V with respect to emitter E1, and isolated power supply P2 can be at, e.g., −0.7 V with respect to emitter E2.

Common source MOSFET pairs (Q11, Q21) and (Q22, Q12) are preferably used for base-emitter shorting between respective emitter-base pairs (E1, B1) and (E2, B2).

JFETs Q31 and Q32 are preferably used at startup to increase blocking voltage, and then are preferably turned off while the converter is running.

MOSFETs Q41 and Q42 are preferably used after device turn-on to reduce forward voltage drop Vf.

Figure 12:
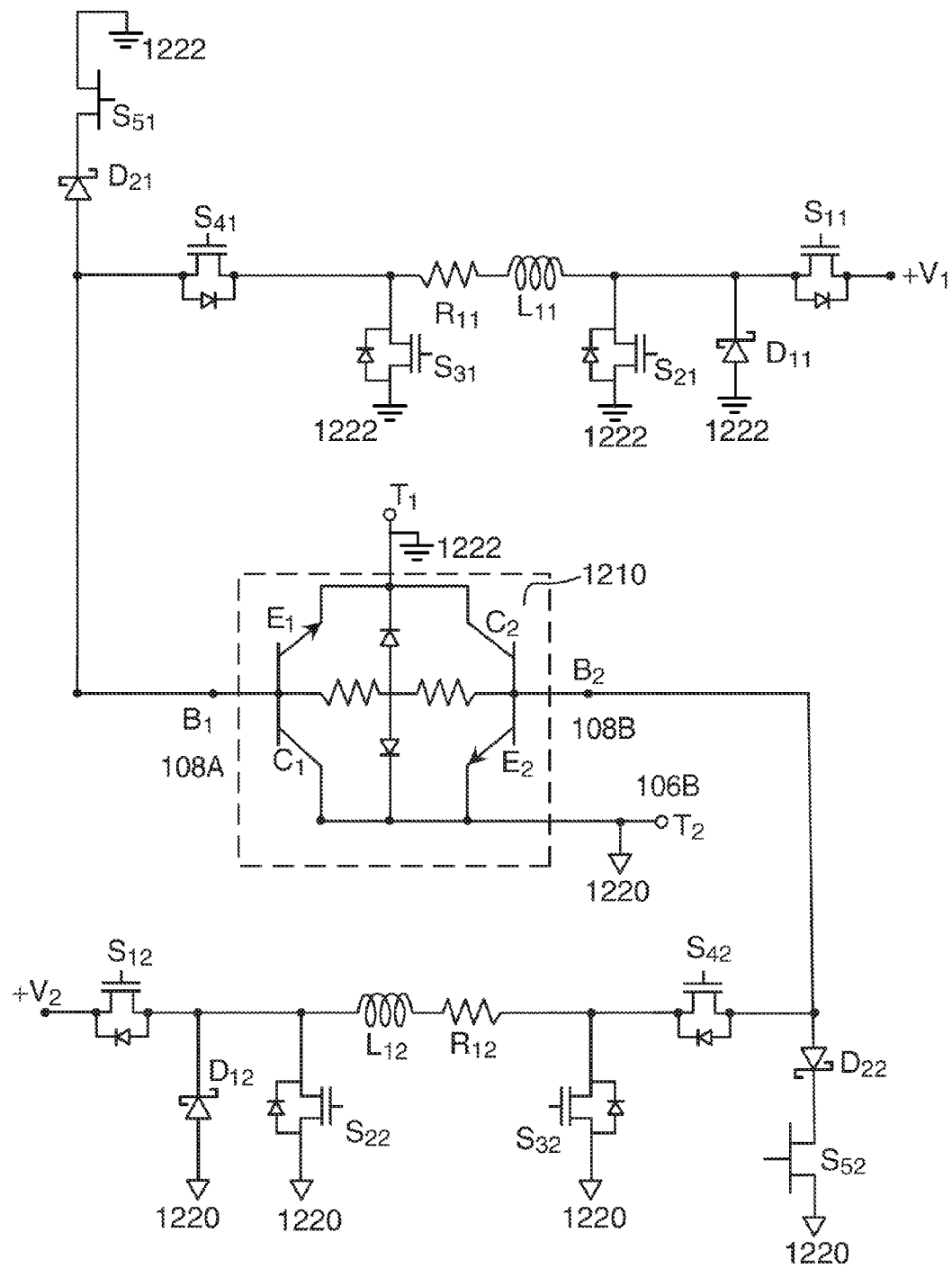
FIG. 12 shows another sample embodiment of a base drive circuit.

FIG. 12 shows a presently-preferred sample embodiment of a base drive circuit for NPN BTRAN 1210. Two common grounds are shown. Common ground 1222 connects together emitter/collector terminal T1 and the base drive circuitry driving base B1 108A. Common ground 1220 connects together emitter/collector terminal T2 and the base drive circuitry driving base B2 108B.

In one sample embodiment, this base drive circuitry can drive base terminal B2 108B in one of three modes. In passive off mode, base terminal B2 108B is preferably clamped (e.g. by Schottky diode $D_{22}$) to be no higher than e.g. about 0.3V relative to emitter 106B, and is allowed to be lower in voltage than emitter 106B. In passive off mode, only normally-on JFET $S_{52}$ is on. This can permit base B2 108B to float, as in e.g. FIG. 3F.

In base-emitter shorting mode, only MOSFET switches $S_{42}$ and $S_{32}$ are on, thereby shorting base B2 108B to emitter T2 106B.

Injection mode, for NPN BTRANs, injects current into the respective base terminal when the device is in active on mode. This can lower the forward voltage drop of the BTRAN to less than a diode drop, e.g. 0.7 volts. In some sample embodiments, this step can lower the forward voltage drop Vf to e.g. 0.1-0.2 V. Switch $S_{42}$ is on, while switches $S_{32}$ and $S_{52}$ are off MOSFET switches $S_{12}$ and $S_{22}$ are controlled on and off to produce an appropriate current into base terminal B2 in switch mode power supply configuration. Current swings can be controlled by inductors L11 and L12, and current can be sensed by resistors R11 and R12. A suitable control system (not shown) controls the switches, inductors, and resistors in order to control the base current, to thereby produce a low forward voltage drop Vf.

Fabrication

In one sample embodiment, the deposition of hydrogenated amorphous silicon (a-Si:H) or hydrogenated amorphous silicon carbide (a-SiC:H) can advantageously be used for fabricating BTRANs having heterojunction emitters as described herein. This material can be sputtered, but is more preferably deposited using chemical vapor deposition (CVD) or plasma enhanced CVD. Since these materials are altered by high temperature processing, the emitter material needs to be deposited after the high temperature processing steps have been completed.

In one sample embodiment, tunnel oxide can be fabricated between base and emitter regions as described herein. The bare surface of the base region can be exposed to an oxidizing ambient long enough to grow a thin layer of a dielectric that is primarily e.g. silicon dioxide. In one sample embodiment, this thin layer of tunnel oxide can be e.g. in the range of 10 Å-30 Å. Following such an oxidation step, a layer of amorphous or polycrystalline silicon can be deposited, e.g. using low pressure chemical vapor deposition (LPCVD). In some sample embodiments, this can be followed by introducing a dopant such as e.g. arsenic to dope the polycrystalline silicon.

The present inventors have realized that physical and electrical performances can be made nearly equivalent on both sides of a BTRAN semiconductor die. All dopant species are introduced into each side of the wafer, and then a single long high-temperature diffusion step is preferably performed.

In one sample embodiment, the long high-temperature diffusion step can be, e.g., at a temperature of 1100-1150° C. Long high-temperature diffusion processes can most preferably be used in conjunction with the two handle-wafer process described below, but can also be used independently of the two handle-wafer process.

Presently-preferred processing steps for fabricating a BTRAN according to the present inventions include masking operations, thermal oxidation, etching, impurity introduction, chemical vapor deposition (CVD), and physical vapor deposition (PVD).

A sample fabrication sequence according to the present inventions most preferably includes both a high-temperature-handle-wafer bonding step and a medium-temperature-handle-wafer bonding step. These two handle wafers are preferably attached to different sides of the same wafer at different points in the fabrication sequence, and preferably in different temperature ranges.

"High temperature", in the context of the present innovative processes, can mean, e.g., any temperature above the alloy/anneal temperature of aluminum or aluminum alloys. In one sample embodiment, "high temperature" can refer to, e.g., any temperature above approximately 450° C.

"Medium temperature", in the context of the present innovative processes, can mean, e.g., any temperature between the melting temperature of solder and the alloying temperature of aluminum or aluminum alloys (inclusive). In one sample embodiment, "medium temperature" can refer to, e.g., any temperature between approximately 240° C. and approximately 450° C. (inclusive).

"Low temperature", in the context of the present innovative processes, can mean, e.g., any temperature between approximately room temperature and the melting temperature of solder. In one sample embodiment, "low temperature" can refer to, e.g., any temperature between approximately 25° C. and 240° C.

In one sample embodiment, a BTRAN fabrication sequence according to the present innovative processes can proceed e.g. as follows:

Step 1 through Step M: Perform all high temperature steps, such as thermal oxidation, some chemical vapor deposition (CVD) operations, and high temperature anneals, up to the contact mask step, on one side of the wafer. This stops just short of a high-temperature, relatively-long diffusion step designed to diffuse impurities to a desired junction depth on both sides of the wafer.

Figure 16A:
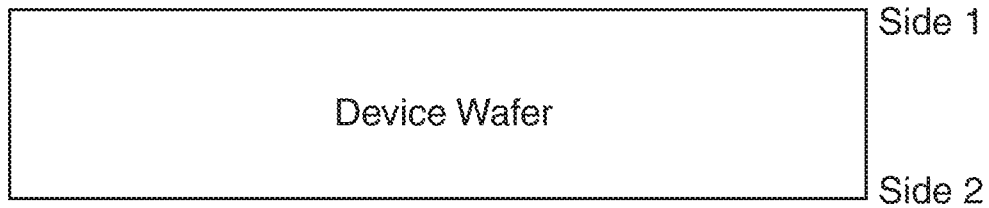
FIGS. 16A, 16B, 16C, 16D, and 16E show one sample process for fabricating a device according to the present inventions.

Step M+1: Deposit a protective layer (e.g. CVD silicon dioxide) or sandwich of protective layers (e.g. CVD silicon dioxide, CVD silicon nitride, and CVD silicon dioxide) on the first side of the device wafer. The protective layer can prevent unwanted changes to the first side. This protective layer can also serve as a stopping point for a thinning operation later used to remove material from the first side. Chemical-mechanical planarization (CMP) can be performed to flatten the top surface of the deposited protective layer (or deposited sandwich of protective layers). A sample of the device at this point can be seen in, e.g., FIG. 16A.

Figure 16B:
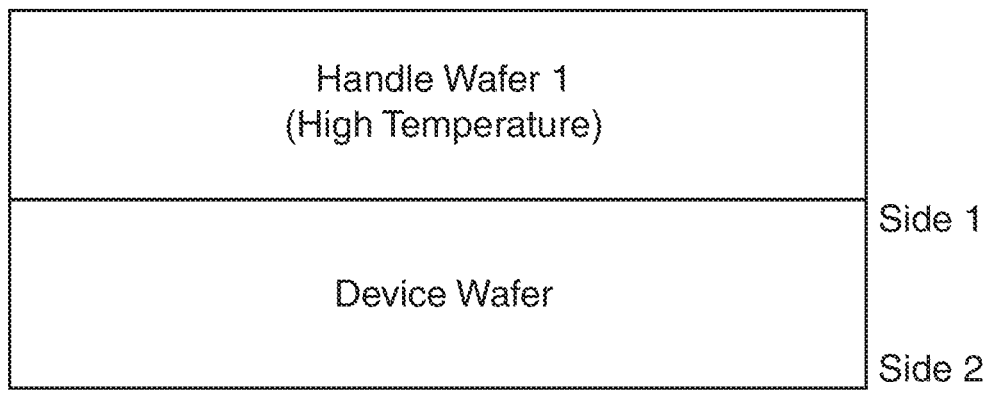

Step M+2: Attach handle wafer 1 to the first side of the device wafer at high temperature. Any acceptable high-temperature material can be used for handle wafer 1, such as e.g. silicon, silicon dioxide, silicon carbide, or sapphire. Handle wafer 1 must bond to the first side of the device wafer. If silicon is used as the handle wafer, the surface of the silicon handle wafer will bond directly to the top of the protective layer or protective layer sandwich at high temperature, as seen in e.g. FIG. 16B.

Step M+3: From a second side opposite the first side, thin the device wafer to the desired thickness. This can be done, e.g., by a combination of grinding, lapping, and polishing.

Step M+4 through Step N: Perform steps 1 through M on the second side of the device wafer.

Step N+1: Perform a relatively long high-temperature diffusion step to obtain the desired dopant junction depths and dopant distribution on both sides of the device wafer.

Step N+2 through Step P: Perform steps from contact mask through passivation layer deposition and a pad etch step on the second side of the device wafer.

Figure 16C:
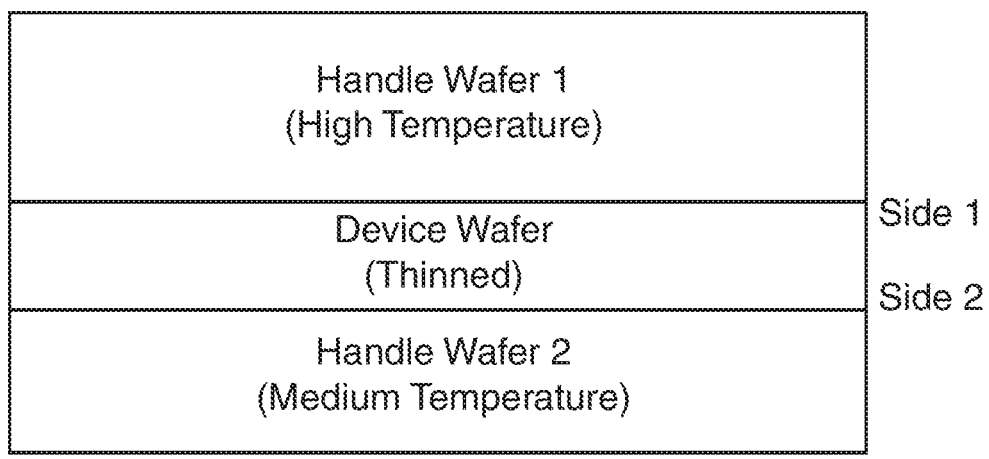

Step P+1: Attach handle wafer 2 to the second side of the device wafer at a medium temperature. Handle wafer 2 can be any acceptable medium-temperature material, such as e.g. quartz, glass, silicon, silicon carbide, and sapphire. In one sample embodiment, the device at this point can be like that seen in e.g. FIG. 16C.

Figure 16D:
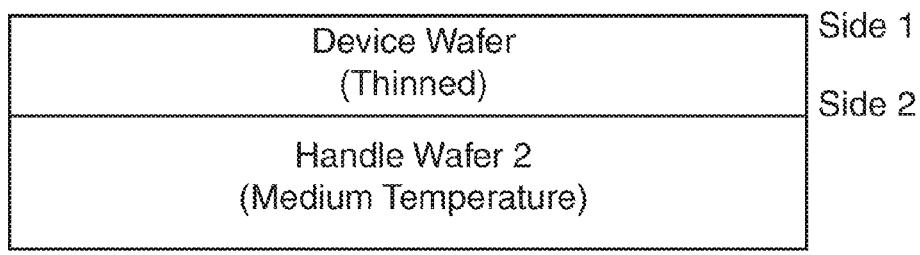

Step P+2: Remove handle wafer 1. This can be done, e.g., by grinding, lapping, chemical-mechanical planarization (CMP), and is most preferably continued up to, but not through, the "stopping point" layer deposited in e.g. Step M+1. As a result of this step, the device wafer can be like that seen in, e.g., FIG. 16D.

Step P+3: Remove the stopping layer (e.g. by etching or chemical-mechanical planarization (CMP)).

Step P+4 through Step Q: Perform the contact mask through the passivation deposition and the pad etching steps on the first side of the device wafer. At this point, the wafer has completed conventional wafer processing.

Step Q+1: Do nothing, apply tape to one side of the wafer, or mount the wafer on a substrate.

Figure 16E:
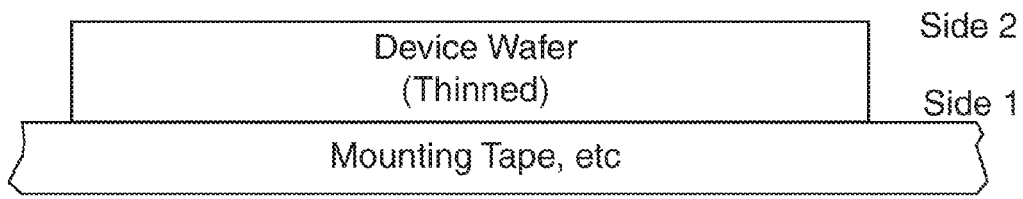

Step Q+2: Remove handle wafer 2 from the second side of the device wafer, resulting in a structure like that of e.g. FIG. 16E.

Step Q+3 through end: Plate one or both sides of the device. Final processing continues through dicing (chip separation) and testing as appropriate.

In one sample embodiment, the first side of the device can be plated before handle wafer 2 is removed from the second side of the device wafer.

In one sample embodiment, BTRAN fabrication can start with double-side-polished starting wafers. Following the high-temperature bonding step, alignment marks can be placed on both exposed surfaces of the bonded wafer stack using an alignment algorithm. In another sample embodiment, front-surface-to-back-surface alignment can be obtained by, e g, infrared alignment, which allows the features on one wafer surface to be "seen" through the wafer during alignment. In yet another sample embodiment, front-back alignment can be obtained by mechanical means, e.g. aligning to the first surface of the wafer while the mask is present on the second surfaces. Each of these front-back alignment techniques has advantages and disadvantages, including associated equipment costs.

In one sample BTRAN fabrication embodiment, double-sided plating of a BTRAN can use the same metal and pad pattern on each surface. Connection to the desired regions on each surface can then be made using a patterned layer. In one sample embodiment, contact can be made to the bottom surface using e.g. a patterned metallization on a ceramic, and to the top surface using e.g. a patterned copper lead frame. The ability to use the same pad mask on both surfaces can greatly simplify fabrication.

In one sample embodiment, contact to both the bottom and the top of the die is preferably obtained by a layer of solder. The solder is typically deposited on the patterned regions which have also been plated, and which are present on each surface of the die.

However, it can be advantageous from a manufacturing perspective to attach the bottom of a BTRAN die to a metallized ceramic using solder, and to bond large-diameter wire to the metallized regions on the top of the die.

One complicating factor, however, is that large regions of plated material, e.g. nickel, have residual stress that can crack or otherwise damage thin die.

The present application teaches inter alia that the same metal and pad masks can be used on both top and bottom surfaces of a BTRAN, subject to three conditions:

1) There are sufficient bonding pads of an appropriate size on the top surface of the die to accommodate the necessary number of large-diameter wire bonds needed.

2) There are enough plated regions on the bottom of the die to allow the formation of a low resistance contact.

3) The pattern of open plated regions does not result in stress large enough to damage the die.

Accordingly, pad masks are proposed for BTRAN fabrication which have a mixture of (typically relatively large) open regions suitable for both wire bonds and a plated layer, and smaller open regions which can be plated but generally not bonded.

Figure 17:
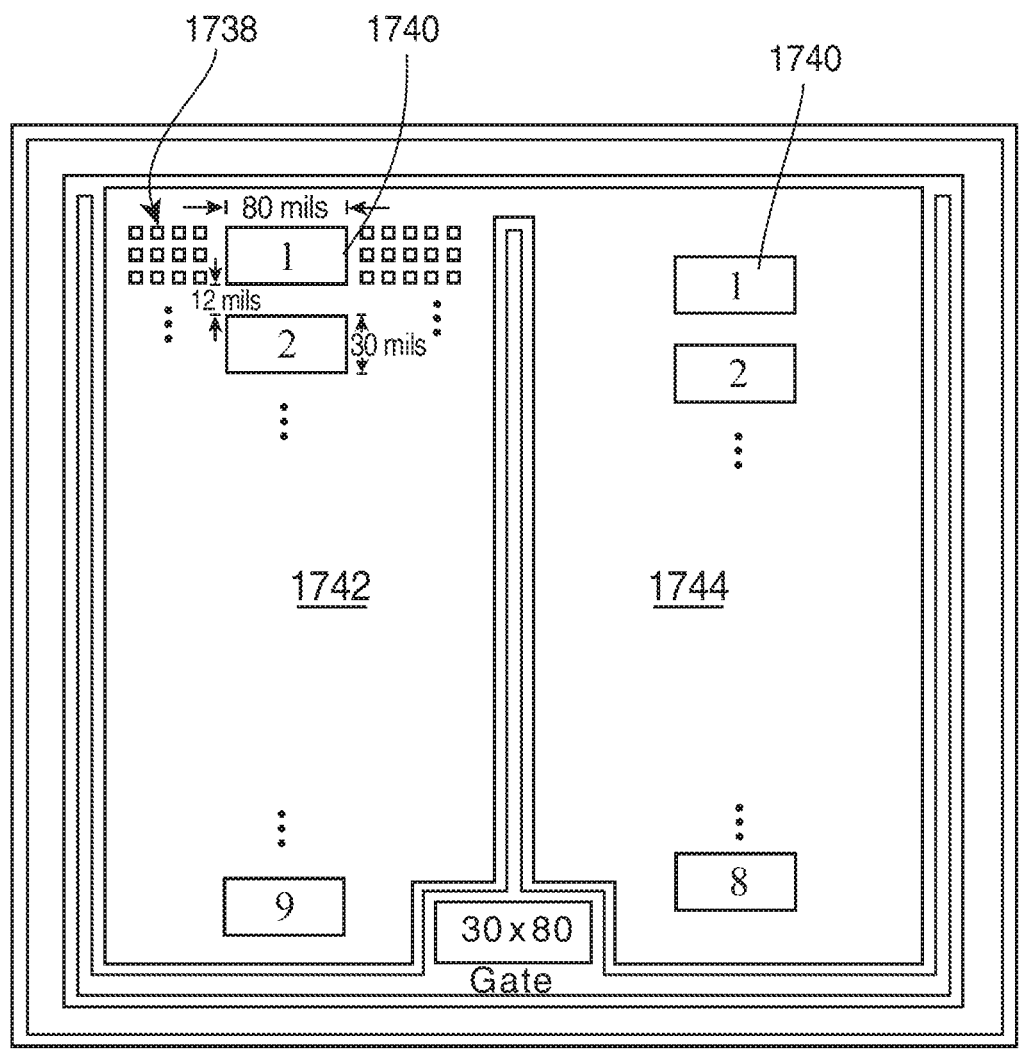
FIG. 17 shows a sample pad mask for fabricating a device according to the present inventions.

One sample embodiment of a pad mask for BTRAN fabrication according to the present inventions can be seen in, e.g., FIG. 17. In FIG. 17, large bonding pads 1740 can be used e.g. for plating or wire bonding. In one sample embodiment, large bonding pads 1740 can be, e.g., 80 mils by 30 mils, and can be spaced e.g. 12 mils apart. Small bonding pads 1738 can fill in the surrounding area not taken by large bonding pads 1740, and can be used e.g. for plating. In one sample embodiment, large bonding pads 1740 in left chip region 1742 can be offset from large bonding pads 1740 in right chip region 1744 to accommodate large-diameter wire on all pads.

Figure 18A:
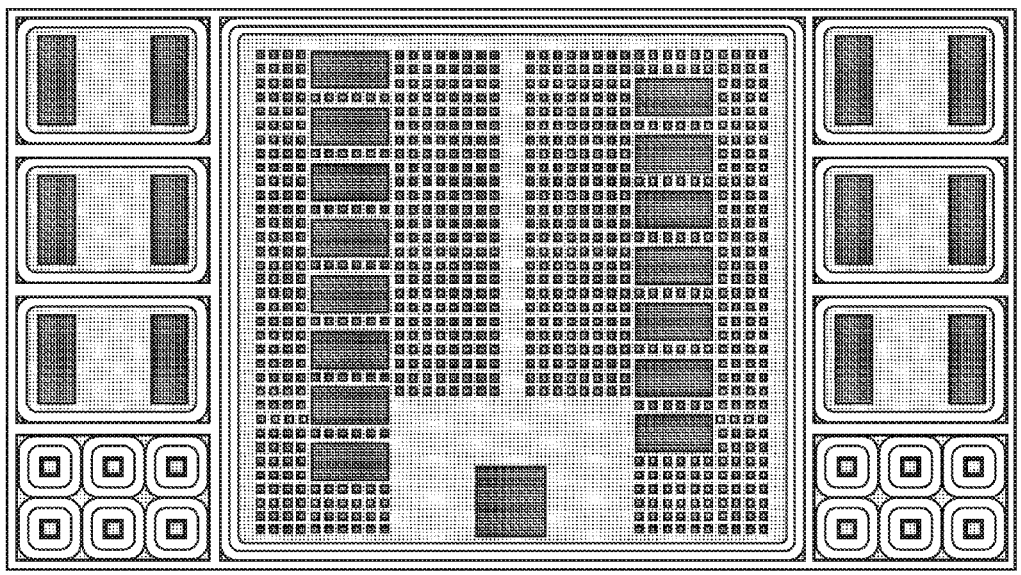
FIGS. 18A-18B show another sample embodiment of a pad mask for fabricating a device according to the present inventions.
Figure 18B:
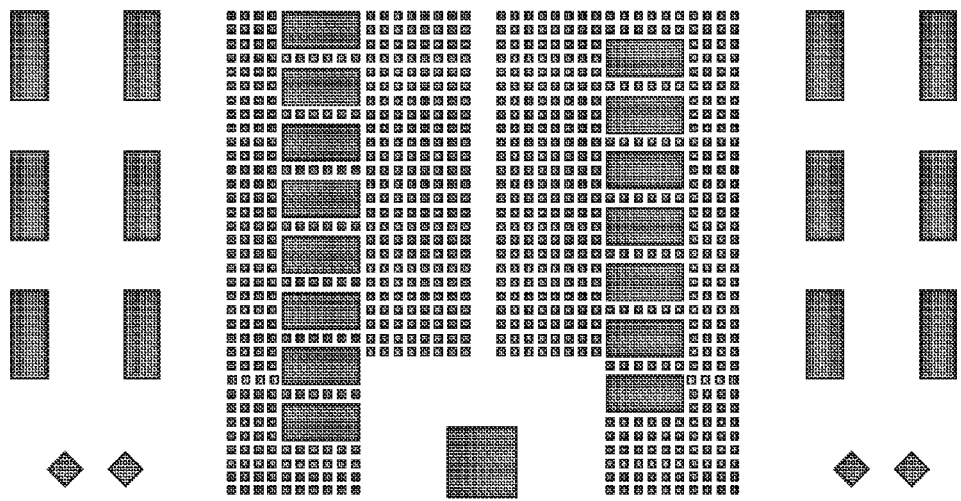

FIGS. 18A-18B show another sample embodiment of BTRAN fabrication according to the present inventions. In FIG. 18A, a sample BTRAN pad mask is shown overlaid on a sample metallization, while in FIG. 18B, only the sample pad mask is shown.

The design of the edge termination structure of a high voltage semiconductor device such as a BTRAN is crucial to its long term operation. A termination structure designed to operate in a given set of conditions can exhibit a considerable reduction in voltage handling ability in the presence of unwanted positive or negative charge at or near the surface of the termination structure. A considerable decrease in breakdown voltage can occur in the presence of either positive or negative charge in the termination region (as demonstrated in "The Effect of Static and Dynamic Parasitic Charge in the Termination Area of High Voltage Devices and Possible Solutions", T. Trajkovic et al., which is hereby incorporated by reference).

Figure 19:
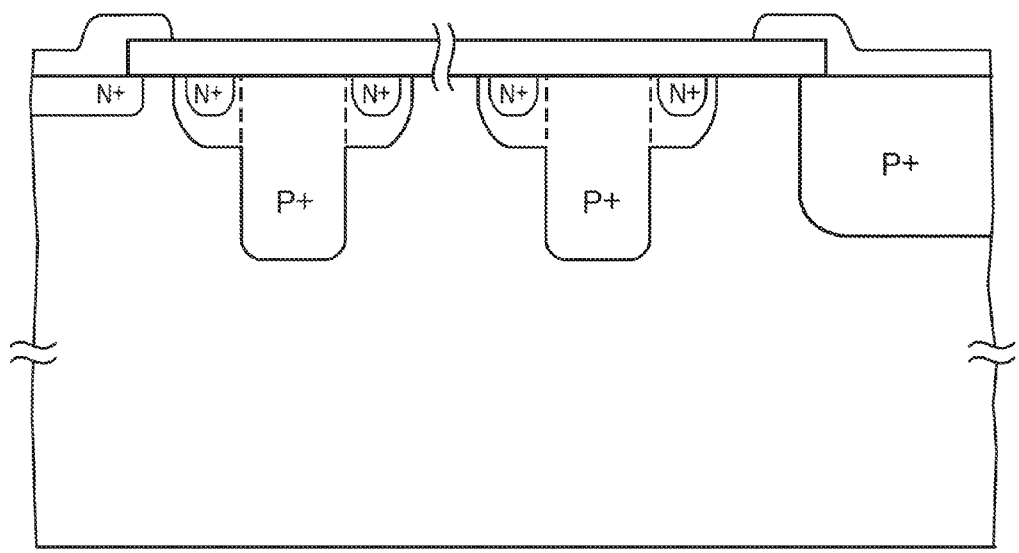
FIG. 19 shows one sample embodiment of a termination structure for a device according to the present inventions.

The present innovative BTRAN fabrication methods also teach (inter alia) the use of novel and innovative structures to prevent any decrease in the breakdown voltage of a device by the presence of charge in the termination region. One sample embodiment of these innovative structures, as seen in e.g. FIG. 19, can consist of a P+ region that contains one or more n-type regions.

This combination of two doped regions, one within the other, is similar to the body and source of a DMOS transistor, or to the base and emitter of a bipolar transistor.

In one sample embodiment, a BTRAN termination structure according to the present inventions can be fabricated through the use of two masks, one for each dopant type. In another sample embodiment, a BTRAN termination structure according to the present inventions can be fabricated by using a single mask with both dopant types introduced through the same opening. In each of these cases, the required openings can be added to pre-existing masking layers, with the final dopant distributions being obtained using existing dopant-introduction and diffusion steps.

Figure 20A:
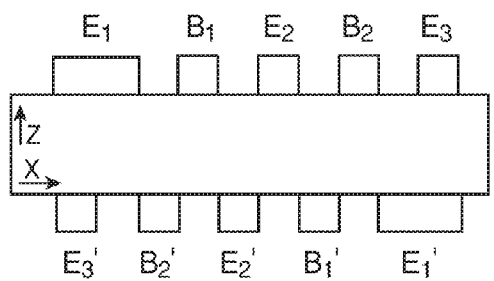
FIGS. 20A, 20B, 20C, and 20D show sample embodiments of pad arrangements according to the present inventions.
Figure 20B:
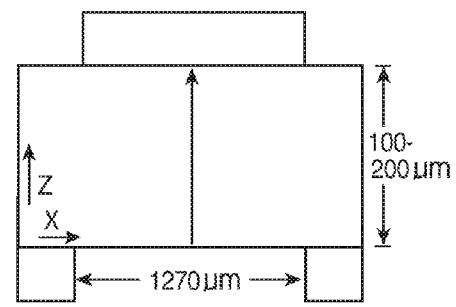
Figure 20C:
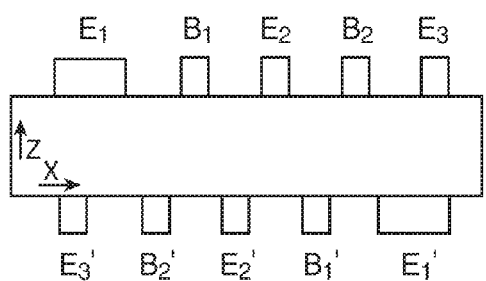
Figure 20D:
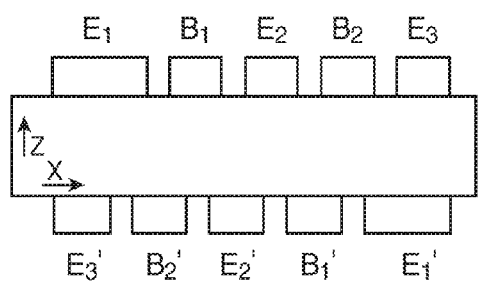

In some sample embodiments, innovative bidirectional devices of the present inventions can have pad metallizations which are not symmetric between the front and back of a device, as in e.g. FIG. 20A. FIG. 20B shows how offset contact pads can significantly improve thermal dissipation by significantly reducing the distance from any point in the die to a region with low thermal resistance. In one sample embodiment, contact pads on each side can be spaced e.g. 1270 μm apart (in the x direction), and the die can be e.g. 100-200 μm thick (in the z direction). In one sample embodiment, contact pads on each side of the die can be offset to minimize distance to regions with low thermal resistance. FIGS. 20C-20D show alternative embodiments of pad metallization fractions.

Advantages

The disclosed innovations, in various embodiments, provide one or more of at least the following advantages. However, not all of these advantages result from every one of the innovations disclosed, and this list of advantages does not limit the various claimed inventions.

On-state voltage drop is less than a diode drop.

Bidirectional operation is achieved with identical electrical characteristics in either direction.

Provides totally flat planar device.

Bidirectional bipolar transistors operate under conditions of high non-equilibrium carrier concentration.

High voltage resistance.

High ruggedness.

Innovative fabrication techniques enable two-sided bidirectional device fabrication.

Fully bidirectional conduction with less than a diode drop in each direction.

Enables fully-bidirectional switching in power-packet-switching power converters.

No double-diffused base necessary.

According to some but not necessarily all embodiments, there is provided: Methods, systems, circuits, and devices for power-packet-switching power converters using bidirectional bipolar transistors (BTRANs) for switching Four-terminal three-layer BTRANs provide substantially identical operation in either direction with forward voltages of less than a diode drop. BTRANs are fully symmetric merged double-base bidirectional bipolar opposite-faced devices which operate under conditions of high non-equilibrium carrier concentration, and which can have surprising synergies when used as bidirectional switches for power-packet-switching power converters. BTRANs are driven into a state of high carrier concentration, making the on-state voltage drop very low.

According to some but not necessarily all embodiments, there is provided: A power-packet-switching power converter, comprising: a plurality of phase legs which each include two bidirectional switches which can connect a respective external line to either side of a link inductor which is paralleled by a capacitor, each said bidirectional switch comprising: first and second first-conductivity-type emitter regions on opposing faces of a second-conductivity-type semiconductor mass, and first and second second-conductivity-type base contact regions, in proximity to said first and second emitter regions respectively; control circuitry which, repeatedly, turns on a selected one or two of said bidirectional switches to drive energy from one or more input lines into said inductor, and then turns off all of said switches to disconnect said inductor, and then turns on a different selected one or two of said bidirectional switches to drive energy from said inductor onto one or two output lines; and a drive circuit which, when the control circuitry selects one of said bidirectional switches for turn-on, drives a base contact region of that switch, to forward bias the associated emitter-base junction and permit majority carriers to flow to the other emitter region on the opposing surface; wherein the drive circuit applies sufficient current to the selected base contact region to generate a nonequilibrium carrier concentration, in the interior of said semiconductor mass, which is more than thirty times as great as the off-state equilibrium majority carrier concentration in the semiconductor mass, to thereby lower the voltage drop across the switch.

According to some but not necessarily all embodiments, there is provided: A power-packet-switching power converter, comprising: a plurality of phase legs which each include two bidirectional switches which can connect a respective external line to either side of a link inductor which is paralleled by a capacitor, each said bidirectional switch comprising: first and second first-conductivity-type emitter regions on opposing faces of a second-conductivity-type semiconductor mass, and first and second second-conductivity-type base contact regions, in proximity to said first and second emitter regions respectively; control circuitry which, repeatedly, turns on a selected one or two of said bidirectional switches to drive energy from one or more input lines into said inductor, and then turns off all of said switches to disconnect said inductor, and then turns on a different selected one or two of said bidirectional switches to drive energy from said inductor onto one or two output lines; and a drive circuit which, when the control circuitry selects one of said bidirectional switches for turn-on, drives a base contact region of that switch, to forward bias the associated emitter-base junction and permit majority carriers to flow to the other emitter region on the opposing surface; wherein the drive circuit applies sufficient current to the selected base contact region to drive the beta down to less than one-quarter of its small-signal value.

According to some but not necessarily all embodiments, there is provided: A power-packet-switching power converter, comprising: a plurality of phase legs which each include two bidirectional switches which can connect a respective external line to either side of a link inductor which is paralleled by a capacitor, each said bidirectional switch comprising: first and second first-conductivity-type emitter regions on opposing faces of a second-conductivity-type semiconductor mass, and first and second second-conductivity-type base contact regions, in proximity to said first and second emitter regions respectively; control circuitry which, repeatedly, turns on a selected one or two of said bidirectional switches to drive energy from one or more input lines into said inductor, and then turns off all of said switches to disconnect said inductor, and then turns on a different selected one or two of said bidirectional switches to drive energy from said inductor onto one or two output lines; and a drive circuit which, when the control circuitry selects one of said bidirectional switches for turn-on, drives a base contact region of that switch, to forward bias the associated emitter-base junction and permit majority carriers to flow to the other emitter region on the opposing surface; wherein the drive circuit applies sufficient current to the selected base contact region to generate a nonequilibrium carrier concentration, in the interior of said semiconductor mass, which is more than thirty times as great as the off-state equilibrium majority carrier concentration, to thereby lower the voltage drop across the switch to less than half a diode drop.

According to some but not necessarily all embodiments, there is provided: A power-packet-switching power converter, comprising: a plurality of phase legs which each include two bidirectional switches which can connect a respective external line to either side of a link inductor which is paralleled by a capacitor; each said bidirectional switch comprising: first-conductivity-type emitter regions on opposing faces of a second-conductivity-type semiconductor mass, and second-conductivity-type base contact regions in proximity to respective emitter regions; control circuitry which turns on two of said bidirectional switches to drive energy from one or more input lines into said inductor, and then turns off all of said switches to disconnect said inductor, and then turns on a different two of said bidirectional switches to drive energy from said inductor onto one or two output lines; and a drive circuit which, when the control circuitry selects one of said bidirectional switches for turn-on: begins turn-on by shorting a first one of the base contact regions of that switch to the respective emitter region, while leaving the base contact regions on the opposing face of that switch floating; drives said first one of the base contact regions, to forward bias the associated emitter-base junction and permit majority carriers flow to the other emitter region on the opposing surface, thereby entering saturation mode; shorts said first one of the base contact regions to the respective emitter region, thereby exiting saturation mode; begins turn-off by shorting the base contact region on the opposing surface to the respective emitter region; and completes turn-off by causing said first one of the base contact region to float; wherein the drive circuit applies sufficient current to the selected base contact region to generate a nonequilibrium carrier concentration, in said semiconductor mass, to thereby lower the voltage drop across the switch.

According to some but not necessarily all embodiments, there is provided: A bidirectional power switching circuit, comprising: first and second first-conductivity-type emitter regions on opposing faces of a second-conductivity-type semiconductor mass, and first and second second-conductivity-type base contact regions, in proximity to said first and second emitter regions respectively; and a drive circuit which, when the control circuitry selects one of said bidirectional switches for turn-on, drives a base contact region of that switch, to forward bias the associated emitter-base junction and permit majority carriers to flow to the other emitter region on the opposing surface; wherein the drive circuit applies sufficient current to the selected base contact region to generate a nonequilibrium carrier concentration, in the interior of said semiconductor mass, which is more than thirty times as great as the off-state equilibrium majority carrier concentration, to thereby lower the voltage drop across the switch.

According to some but not necessarily all embodiments, there is provided: A method of operating a power-packet-switching power converter, comprising: driving a first array of bidirectional switches to drive power into a link inductor which is paralleled by a capacitor; driving a second array of bidirectional switches to draw power onto an output line from said inductor; wherein each said bidirectional switch comprises first-conductivity-type emitter regions on opposing faces of a second-conductivity-type base region, and second-conductivity-type base contact regions on said opposing faces of said second-conductivity-type base region; wherein driving each said bidirectional switch comprises: when one said face of one said bidirectional switch is desired to be in passive off mode, clamping a voltage of the respective base contact region to be less than or equal to a voltage of the respective emitter region plus a Schottky diode drop; when one said face of one said bidirectional switch is desired to be in active off mode or in diode mode, shorting the respective base contact region to the respective emitter region; and when one said face of one said bidirectional switch is desired to be in active on mode, injecting minority charge carriers into the respective base contact region.

According to some but not necessarily all embodiments, there is provided: A semiconductor device, comprising: first-conductivity-type emitter regions on opposing faces of a second-conductivity-type semiconductor mass; second-conductivity-type base contact regions on said opposing faces of said second-conductivity-type semiconductor mass; wherein said first-conductivity-type emitter regions and said second-conductivity-type semiconductor mass form a heterojunction therebetween; drive circuitry which applies sufficient current to the selected base contact region to generate a nonequilibrium carrier concentration, in the interior of said semiconductor mass, which is more than thirty times as great as the off-state equilibrium majority carrier concentration, to thereby lower the voltage drop.

According to some but not necessarily all embodiments, there is provided: A semiconductor device, comprising: first-conductivity-type emitter regions on opposing faces of a second-conductivity-type semiconductor mass; second-conductivity-type base contact regions on said opposing faces of said second-conductivity-type semiconductor mass; a thin layer of tunnel oxide between each said first-conductivity-type emitter region and said second-conductivity-type semiconductor mass, and which forms a differential between holes and electrons; drive circuitry which applies sufficient current to the selected base contact region to generate a nonequilibrium carrier concentration, in the interior of said semiconductor mass, which is more than thirty times as great as the off-state equilibrium majority carrier concentration, to thereby lower the voltage drop.

According to some but not necessarily all embodiments, there is provided: A semiconductor device, comprising: first-conductivity-type emitter regions on opposing faces of a second-conductivity-type semiconductor mass; second-conductivity-type base contact regions on said opposing faces of said second-conductivity-type semiconductor mass; a thin layer of tunnel oxide between each said first-conductivity-type emitter region and a respective emitter metallization, and which forms a differential between holes and electrons; drive circuitry which applies sufficient current to the selected base contact region to generate a nonequilibrium carrier concentration, in the interior of said semiconductor mass, which is more than thirty times as great as the off-state equilibrium majority carrier concentration, to thereby lower the voltage drop.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some embodiments, oxide trenches 1330 can be present between source regions and adjacent base contact regions. In other embodiments, this can be different.

In some heterojunction embodiments, emitter/collector regions can be amorphous silicon on a crystalline silicon substrate. In other embodiments, heterojunctions can be formed differently.

In most presently-preferred embodiments, base contact regions are more heavily doped than the majority of the base. However, in other embodiments, this can be different.

In some heterojunction sample embodiments, heterojunctions can be provided by junctions between e.g. amorphous and crystalline silicon. In other embodiments, heterojunctions can be e.g. provided by different materials. In still other embodiments, heterojunctions can be provided by e.g. crystalline-crystalline junctions, between e.g. crystalline silicon and a different crystalline semiconductor, provided e.g. that the resultant junction potentials are sharp enough to increase injection efficiency.

In one contemplated alternative embodiment, smaller emitter metallization fractions can be used to reduce hole recombination and thereby increase injection efficiency.

In some sample embodiments of heterojunction BTRANs, heterojunction emitter/collector regions can be e.g. amorphous silicon. In other sample embodiments, heterojunction emitter/collector regions can be e.g. polycrystalline silicon. In still other embodiments, this can be different.

In some embodiments, one base can be driven more than the other base.

In some embodiments, other methods for increasing injection efficiency in high level non-equilibrium carrier densities can be used, singly or in combination with the innovative techniques disclosed herein.

In some alternative embodiments, the innovative BTRAN fabrication techniques described herein can be applied to other two-sided bidirectional devices, such as e.g. bidirectional IGBTs.

In some alternative embodiments, the innovative devices of the present inventions can be advantageously applied to different sorts of power converters. In some alternative embodiments, the present innovative devices can be used for e.g. matrix converters. In other alternative embodiments, the present innovative devices can be applied to e.g. voltage reduction regulators as used for induction motor efficiency optimization and soft start.

In some alternative embodiments, emitter regions can be recessed emitters located in trenches. In other alternative embodiments, base contact regions can be recessed base contact regions located in trenches.

In some alternative embodiments, field-shaping regions can be present below base contact regions or emitter regions or both.

Additional general background, which helps to show variations and implementations, can be found in the following publications, all of which are hereby incorporated by reference: "The Effect of Static and Dynamic Parasitic Charge in the Termination Area of High Voltage Devices and Possible Solutions", T. Trajkovic et al.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. Pat. No. 8,406,265, U.S. Pat. No. 8,400,800, U.S. Pat. No. 8,395,910, U.S. Pat. No. 8,391,033, U.S. Pat. No. 8,345,452, U.S. Pat. No. 8,300,426, U.S. Pat. No. 8,295,069, U.S. Pat. No. 7,778,045, U.S. Pat. No. 7,599,196; US 2012-0279567 A1, US 2012-0268975 A1, US 2012-0274138 A1, US 2013-0038129 A1, US 2012-0051100 A1; PCT/US14/16740, PCT/US14/26822, PCT/US14/35954, PCT/US14/35960; 14/182,243, 14/182,236, 14/182,245, 14/182,246, 14/183,403, 14/182,249, 14/182,250, 14/182,251, 14/182,256, 14/182,268, 14/183,259, 14/182,265, 14/183,415, 14/182,280, 14/183,422, 14/182,252, 14/183,245, 14/183,274, 14/183,289, 14/183,309, 14/183,335, 14/183,371, 14/182,270, 14/182,277, 14/207,039, 14/209,885, 14/260,120, 14/265,300, 14/265,312, 14/265,315; U.S. Provisionals 61/765,098, 61/765,099, 61/765,100, 61/765,102, 61/765,104, 61/765,107, 61/765,110, 61/765,112, 61/765,114, 61/765,116, 61/765,118, 61/765,119, 61/765,122, 61/765,123, 61/765,126, 61/765,129, 61/765,131, 61/765,132, 61/765,137, 61/765,139, 61/765,144, 61/765,146 all filed Feb. 15, 2013; 61/778,648, 61/778,661, 61/778,680, 61/784,001 all filed Mar. 13, 2013; 61/814,993 filed Apr. 23, 2013; 61/817,012, 61/817,019, 61/817,092 filed Apr. 29, 2013; 61/838,578 filed Jun. 24, 2013; 61/841,618, 61/841,621, 61/841,624 all filed Jul. 1, 2013; 61/914,491 and 61/914,538 filed Dec. 11, 2013; 61/924,884 filed Jan. 8, 2014; 61/925,311 filed Jan. 9, 2014; 61/928,133 filed Jan. 16, 2014; 61/928,644 filed Jan. 17, 2014; 61/929,731 and 61/929,874 filed Jan. 21, 2014; 61/931,785 filed Jan. 27, 2014; 61/932,422 filed Jan. 28, 2014; 61/933,442 filed Jan. 30, 2014; 62/007,004 filed Jun. 3, 2014; and all priority applications of any of the above thereof, each and every one of which is hereby incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method for switching a power semiconductor device which includes first emitter/collector and base contact regions on a first surface of a semiconductor die, and second emitter/collector and base contact regions on a second surface of the die; wherein the emitter/collector regions both have a first conductivity type, and the base contact regions and the semiconductor die all have a second conductivity type; comprising the steps:
    in the ON state, when an external voltage difference applied between the first and second emitter/collector regions has a polarity such that the first and second emitter/collector regions can act as collector and emitter respectively, flowing base current through the first base contact region, but substantially not through the second base contact region; and
    in the OFF state, not flowing external current through either of the base contact regions;
    whereby bidirectional switching is achieved with an on-state voltage drop which is less than a diode drop between the semiconductor die and a respective one of the emitter/collector regions.

2. The method of claim 1, wherein the semiconductor die is silicon.

3. The method of claim 1, wherein the step of flowing current through the base contact region draws current from the base contact region.

4. The method of claim 1, wherein the step of flowing current through the base contact region supplies current to the base contact region.

5. The method of claim 1, further comprising, in the OFF state, floating one of the base contact regions.

6. The method of claim 1, further comprising, in the ON state, conducting current as a diode, before the step of flowing base current.

7. A method for switching a power semiconductor device which includes distinct first and second first-conductivity-type emitter/collector regions which are not electrically connected together except through the semiconductor die itself and also includes distinct first and second second-conductivity-type base contact regions which are not electrically connected together except through the semiconductor die itself, the emitter/collector regions and the base contact regions all lying within two surfaces of a common semiconductor die, comprising:
    in the ON state, when the applied voltage polarity is such that the first emitter/collector region, on a first of said surfaces, can act as the collector of, and the second emitter/collector region on a second of said surfaces can act as the emitter of, a bipolar transistor, driving the first base contact toward a voltage different from the first emitter/collector region by flowing base current through the first base contact region, on said first surface, while NOT flowing base current through the second base contact region, on said second surface; and
    in the OFF state, floating at least one of the base contact regions, while not applying external current to either of the base contact regions;
    whereby bidirectional switching is achieved with an on-state voltage drop which is less than a diode drop between the semiconductor die and a respective one of the emitter/collector regions.

8. The method of claim 7, wherein the semiconductor die is silicon.

9. The method of claim 7, wherein the step of flowing current through the base contact region draws current from the base contact region.

10. The method of claim 7, wherein the step of flowing current through the base contact region supplies current to the base contact region.

* * * * *